(12) United States Patent
Ishida et al.

(10) Patent No.: US 7,945,403 B2
(45) Date of Patent: May 17, 2011

(54) SIGNAL MEASUREMENT APPARATUS, SIGNAL MEASUREMENT METHOD, RECORDING MEDIA AND TEST APPARATUS

(75) Inventors: Masahiro Ishida, Tokyo (JP); Atsuya Ono, Tokyo (JP)

(73) Assignee: Advantest Corporation, Tokyo (JP)

( * ) Notice: Subject to any disclaimer, the term of this patent is extended or adjusted under 35 U.S.C. 154(b) by 491 days.

(21) Appl. No.: 12/116,972

(22) Filed: May 8, 2008

(65) Prior Publication Data

US 2009/0281747 A1    Nov. 12, 2009

(51) Int. Cl.
*G01R 13/00* (2006.01)
*G06F 17/00* (2006.01)

(52) U.S. Cl. .................................. 702/66; 702/189

(58) Field of Classification Search ............ 702/66, 702/69, 117, 189; 375/226, 371
See application file for complete search history.

(56) References Cited

U.S. PATENT DOCUMENTS 7,421,355 B2 *  9/2008  Hou et al. ................... 702/69
7,715,512 B2 *  5/2010  Ichiyama et al. ............ 375/371

FOREIGN PATENT DOCUMENTS

JP           2002228687        8/2002

* cited by examiner

*Primary Examiner* — Bryan Bui
(74) *Attorney, Agent, or Firm* — Jianq Chyun IP Office

(57) ABSTRACT

Provided is a signal measurement apparatus, including sampling sections that each sample a signal under measurement having a cycle T with a threshold value, where the threshold values of at least two of the sampling sections are different from each other; a waveform reconfiguring section that shapes a reconfigured waveform having the cycle T by rearranging ordinal ranks of sample values corresponding to each threshold value obtained by the sampling sections, a distribution generating section that generates a timing distribution of edges in the reconfigured waveform corresponding to each threshold value; and a calculating section that calculates rise time or fall time of the signal under measurement based on the timing distribution corresponding to each threshold value.

15 Claims, 18 Drawing Sheets

SIGNAL MEASUREMENT APPARATUS, SIGNAL MEASUREMENT METHOD, RECORDING MEDIA AND TEST APPARATUS

BACKGROUND

1. Technical Field

The present invention relates to a signal measurement apparatus, a signal measurement method, a recording medium, and a test apparatus. In particular, the present invention relates to a signal measurement apparatus, a signal measurement method, a recording medium, and a test apparatus for measuring a plurality of signals under measurement using a digital comparator such as a voltage comparator.

2. Related Art

A conventional method for measuring the rise time or the fall time of a signal under measurement (sometimes referred to hereinafter as "the rise/fall time") involves observing the transition edges of the signal under measurement using a sampling oscilloscope. Japanese Patent Application Publication No. 2002-228687 discloses a technique for calculating the rise/fall time by obtaining the timing difference between 10% level cross-point of the signal amplitude and the 90% level cross-point of the signal amplitude.

When measuring with the sampling oscilloscope, however, it is difficult to achieve sufficient measurement accuracy because the sampling frequency is low. Since waveform data of the level cross timing outside of the measurement target range is also sampled, a long sampling time is required to achieve the desired measurement accuracy. Since waveform measurement accuracy of approximately 8 bits is required for sufficient measurement accuracy, this technique cannot be applied to a semiconductor test apparatus that samples a waveform with a 1-bit comparator.

SUMMARY

Therefore, it is an object of an aspect of the innovations herein to provide a signal measurement apparatus, a signal measurement method, a recording medium, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary signal measurement apparatus may include a signal measurement apparatus, including a plurality of sampling sections that each sample a signal under measurement having a cycle T with a threshold value, where the threshold values of at least two of the sampling sections are different from each other; a waveform reconfiguring section that shapes a reconfigured waveform having the cycle T by rearranging ordinal ranks of sample values corresponding to each threshold value obtained by the sampling sections; a distribution generating section that generates a timing distribution of edges in the reconfigured waveform corresponding to each threshold value; and a calculating section that calculates rise time or fall time of the signal under measurement based on the timing distribution corresponding to each threshold value. The sampling sections may each sample the signal under measurement having the cycle T a certain number of times N while the signal under measurement repeats for M cycles, where M and N are coprime. The waveform reconfiguring section may rearrange initial ordinal ranks k of the sample values sampled by the sampling sections to have reconfigured ordinal ranks i by inputting the initial ordinal ranks k into an expression i=k·M mod N, where k is expressed by integers from 0 to N−1, and use these rearranged sample values to shape the reconfigured waveform having the cycle T.

The calculating section may calculate the rise time or the fall time of the signal under measurement based on a difference between expected values of the timing distributions corresponding to the respective threshold values or as a minimum difference or a maximum difference between timing distribution ends of the signal under measurement corresponding to the respective threshold values. The distribution generating section may include a unit-interval waveform generating section that generates a plurality of unit-interval waveforms by dividing the reconfigured waveform into a plurality of unit intervals, an aggregate value calculating section that calculates an aggregate value at each phase in each of the plurality of unit-interval waveforms by adding together the sample values at the same phase of each unit-interval waveform, and a difference calculating section that calculates a difference between each pair of aggregate values at adjacent phases. The distribution generating section may generate the timing distribution based on the difference calculated by the difference calculating section.

The distribution generating section may further include a waveform inverting section that inverts the unit-interval waveforms generated by the unit-interval waveform generating section, and the aggregate value calculating section may add the sample values of the unit-interval waveforms having rising edges to the sample values of the unit-interval waveforms having falling edges that are inverted by the waveform inverting section, or may add the sample values of the unit-interval waveforms having falling edges to the sample values of the unit-interval waveforms having rising edges that are inverted by the waveform inverting section. The signal measurement apparatus may further include an identical data sequence unit-interval waveform group selecting section that selects, from among the unit-interval waveforms generated by the unit-interval waveform generating section, a group of unit-interval waveforms having identical data sequences in the signal under measurement immediately prior thereto, and the aggregate value calculating section may add together the sample values of each unit-interval waveform in the group selected by the identical data sequence unit-interval waveform group selecting section. The aggregate value calculating section may add together the sample values of the unit-interval waveforms having rising edges or the sample values of the unit-interval waveforms having falling edges.

The signal measurement apparatus may further include a prescribed bit unit-interval waveform group selecting section that selects the unit-interval waveforms generated by the unit-interval waveform generating section at prescribed bit intervals in the signal under measurement, and the aggregate value calculating section may add together the sample values of each unit-interval waveform in the group selected by the prescribed bit unit-interval waveform group selecting section. The signal measurement apparatus may further include a prescribed bit unit-interval waveform group selecting section that selects the unit-interval waveforms generated by the unit-interval waveform generating section at prescribed bit intervals in the signal under measurement, and the aggregate value calculating section may add the sample values of the unit-interval waveforms having rising edges to the sample values of the unit-interval waveforms having falling edges that are inverted by the waveform inverting section in the group of unit-interval waveforms selected by the prescribed bit unit-interval waveform group selecting section.

The configurations described above can be adopted in a similar manner to provide a signal measurement method, a recording medium storing thereon a program used by the signal measurement apparatus, and a test apparatus that supplies a test signal to a device under test to test the device under test. The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
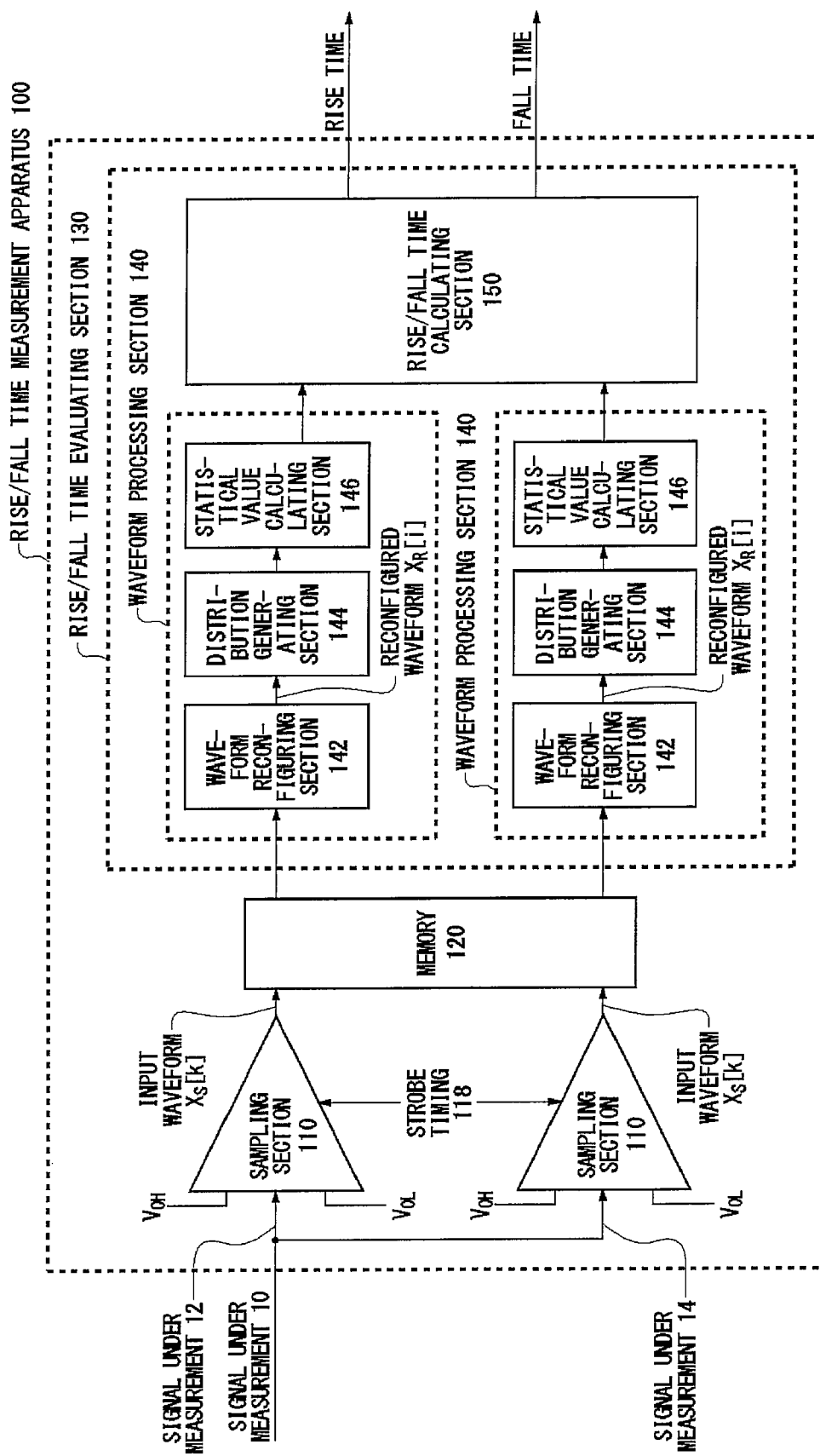
FIG. 1 shows an exemplary configuration of a rise/fall time measurement apparatus 100.

FIG. 1 is a block diagram showing an exemplary configuration of a rise/fall time measurement apparatus 100. The rise/fall time measurement apparatus 100 is an example of a signal measurement apparatus. The rise/fall time measurement apparatus 100 receives a signal under measurement 10 and outputs the rise time or the fall time of the signal under measurement 10. The rise/fall time can express the edge transition time of the signal under measurement 10, and can be obtained by calculating the timing difference of the 20% level cross-points and the 80% level cross-points of the signal amplitude, for example.

As shown in FIG. 1, the rise/fall time measurement apparatus 100 is provided with a sampling section 110, a sampling section 112, and a rise/fall time evaluating section 130, and may also be provided with a memory 120. The sampling section 110 and the sampling section 112 sample the signal under measurement 10 with a plurality of threshold values including at least two threshold values that are different from each other. The rise/fall time measurement apparatus 100 may simultaneously or substantially simultaneously sample the signal under measurement 10 using the sampling section 110 and the sampling section 112 to obtain an average value of the edge timing distribution at the 20% level cross-point and the average value of the edge timing distribution at the 80% level cross-point, for example. The rise/fall time measurement apparatus 100 then obtains the rise time or the fall time by calculating the difference between the average values of the edge timing distributions.

The rise/fall time evaluating section 130 includes a waveform processing section 140 and a rise/fall time calculating section 150. The rise/fall time evaluating section 130 may include a plurality of waveform processing sections 140. The rise/fall time evaluating section 130 may include one waveform processing section 140 for each of the sampling section 110 and the sampling section 112.

The following describes the rise/fall time measurement apparatus 100 as including two waveform processing sections 140, but the rise/fall time measurement apparatus 100 is not limited to such. In the present embodiment, the signal under measurement 10 input into the sampling section 110 is referred to as the signal under measurement 12, and the signal under measurement 10 input into the sampling section 112 is referred to as the signal under measurement 14. One of the waveform processing sections 140 may correspond to the sampling section 110 and the other waveform processing section 140 may correspond to the sampling section 112.

The sampling section 110 samples the signal under measurement 10 having a cycle T. For example, the sampling section 110 samples the signal under measurement 12 having the cycle T a certain number of times N while the signal under measurement 12 is repeating for M cycles, where N and M are coprime. The sampling section 110 may sample the input signal under measurement 12 with a sampling cycle Ts, based on a strobe timing 118, to form an input waveform $X_S[k]$ of the signal under measurement 12. Here, k represents the ordinal rank of the sample values sampled by the sampling section 110, and may be an integer from 0 to N−1. The integer k represents the initial sampling ordinal rank and the value of k in the input waveform $X_S[k]$ increases in the sampled order.

The sampling section 110 is an AD converter or a voltage comparator (sometimes referred to hereinafter as an "ADC"), for example. The sampling section 110 may be a digital comparator or a waveform digitizer. The resolution of the ADC is 1 bit or 1.6 bits, for example. When the ADC with a 1-bit resolution is used, the sample values of the input waveform $X_S[k]$ may be expressed by binary logic values, such as 0 and 1. When the ADC with a 1.6-bit resolution is used, the sample values of the input waveform $X_S[k]$ may be expressed by three values. The sampling section 110 is not limited to sampling the signal under measurement 12 only while the signal under measurement 12 having the cycle T is repeating for M cycles. For example, the sampling section 110 may sample the signal under measurement 12 while the signal under measurement 12 is repeating for 5 M cycles.

The sampling section 112 samples the signal under measurement 14 having the cycle T a certain number of times N while the signal under measurement 14 is repeating for M cycles, where N and M are coprime. The sampling section 112 may sample the input signal under measurement 14 with a sampling cycle Ts, based on a strobe timing 118, to form an input waveform $X_S[k]$ of the signal under measurement 14. The sampling section 112 is identical to the sampling section 110, aside from having a different threshold value.

The memory 120 may store sampling results and the like of the sampling section 110 and the sampling section 112. The memory 120 stores sample values of the input waveform $X_S[k]$ of the signal under measurement 12 and of the input waveform $X_S[k]$ of the signal under measurement 14, obtained respectively by the sampling section 110 and the sampling section 112, in association with k indicating the initial ordinal rank with an integer from 0 to N−1.

The rise/fall time evaluating section 130 calculates respective edge timing distributions of the signal under measurement 12 and the signal under measurement 14 to obtain the rise time or the fall time of these signals. The rise/fall time evaluating section 130 may calculate the rise time or the fall time of edges having specified data patterns. The rise/fall time evaluating section 130 may obtain the rise time or the fall time of the signal under measurement 12 and the signal under measurement 14 by reading the respective input waveforms $X_S[k]$ stored in the memory 120.

Upon receiving the input waveform $X_S[k]$ acquired from the memory 120, the waveform processing section 140 outputs the statistical value of the edge timing distribution of the signal under measurement 12, for example. The waveform processing section 140 outputs the edge timing distribution of the signal under measurement 14 in the same manner as that of the signal under measurement 12 if of the input waveform $X_S[k]$ of the signal under measurement 14 is received. The waveform processing section 140 has a waveform reconfiguring section 142, a distribution generating section 144, and a statistical value calculating section 146.

The waveform reconfiguring section 142 rearranges the order of the sample values of the input waveform $X_S[k]$ sampled by the sampling section 110 or the sampling section 112 to shape a reconfigured waveform $X_R[i]$ having a cycle T. Here, i represents the rearranged ordinal rank. The relationship between the rearranged ordinal rank i and the initial ordinal rank k is shown by Expression 1, and i may be an integer from 0 to N−1. When M is expressed by M=nN+1, where n is any natural number, the rearranging process described above can be omitted since i=k.

$$i=(k \cdot M) \bmod N \qquad \text{Expression 1}$$

When the signal under measurement 12 or the signal under measurement 14 has the cycle T and M and N are coprime, the sampling section 110 or the sampling section 12 can sample the signal under measurement 12 or the signal under measurement 14 with a cycle Te that is shorter than a sampling cycle Ts. This effective sampling cycle Te is shown by Expression 2. Hereinafter, the effective sampling cycle Te is sometimes referred to as an "equivalent sampling time interval".

$$Te=T/N=Ts/M \qquad \text{Expression 2}$$

The distribution generating section 144 generates a timing distribution of the edges in the reconfigured waveform $X_R[i]$ of the corresponding threshold value. This distribution is sometimes referred to hereinafter as an "edge timing distribution," and the edge timing distribution is an example of the timing distribution. The edge timing distribution may be a PDF of the timing of each edge in the signal under measurement 12 or the signal under measurement 14.

The statistical value calculating section 146 calculates the statistical value of the edge timing distribution. The statistical value calculating section 146 may calculate an expected value of the edge timing distribution and a distribution width of the edge timing distribution as the statistical value. Here, the expected value may be an average value. The distribution width may be an indicator of the range of the data variation, such as a variance, a standard deviation, a quartile deviation, an RMS value, a peak-to-peak value, and a half width. In the present embodiment, the phrase "distribution ends" refers to both ends of the distribution width, which are the minimum value and the maximum value of the edge timing distribution, for example. The distribution ends may be obtained using the average value of the edge timing distribution and the distribution width of the standard deviation or the like.

The rise/fall time calculating section 150 is an example of a calculating section. The rise/fall time calculating section 150 calculates the rise time or the fall time of the signal under measurement 10 based on the edge timing distributions corresponding to the plurality of threshold values. The rise/fall time calculating section 150 may output the rise/fall time as the difference between the expected value of the edge timing distribution of the signal under measurement 12 and the expected value of the edge timing distribution of the signal under measurement 14. The rise/fall time calculating section 150 may calculate the difference between the distribution ends of the edge timing distribution of the signal under measurement 12 and the distribution ends of the edge timing distribution of the signal under measurement 14, and output the maximum difference or the minimum difference between the distribution ends as the rise time or the fall time.

The rise/fall time measurement apparatus 100 may be hardware or may be software that causes a processor, not shown, to execute a process. The processor may be a CPU or a computer controlling the process. The functions of the elements included in the rise/fall time evaluating section 130 are not strictly separated. For example, the statistical value calculating section 146 may have the functions of the distribution generating section 144 and the rise/fall time calculating section 150 may have the functions of the waveform processing section 140.

Figure 2:
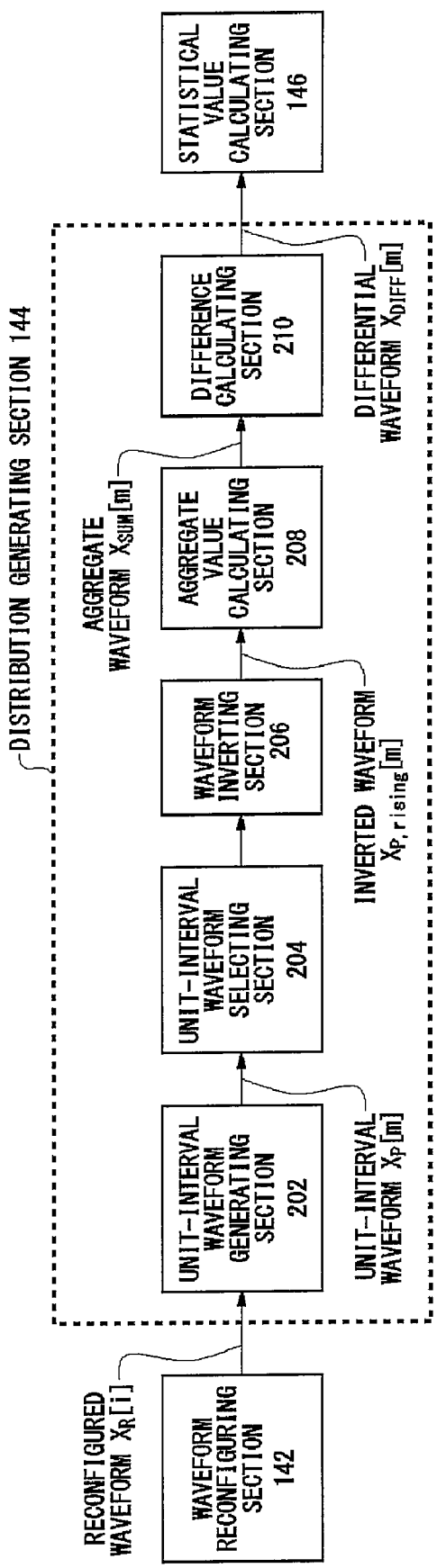
FIG. 2 shows an exemplary configuration of a waveform processing section 140.

FIG. 2 is a block diagram showing an exemplary configuration of the waveform processing section 140. The waveform processing section 140 includes the waveform reconfiguring section 142, the distribution generating section 144, and the statistical value calculating section 146, as described above. The distribution generating section 144 includes a unit-interval waveform generating section 202, an aggregate value calculating section 208, and a difference calculating section 210, and may also include a unit-interval waveform group selecting section 204 and a waveform inverting section 206. The following describes the waveform processing section 140 receiving the input waveform $X_S[k]$ of the signal under measurement 12, but the waveform processing section 140 performs the same process upon receiving the input waveform $X_S[k]$ of the signal under measurement 14.

Upon receiving the reconfigured waveform $X_R[i]$ from the waveform reconfiguring section 142, the unit-interval waveform generating section 202 divides $X_R[i]$ into a prescribed number of unit intervals Tu to generate a plurality of unit-interval waveforms $X_p[m]$. The unit-interval waveform generating section 202 desirably divides the reconfigured waveform $X_R[i]$ such that each unit-interval waveform $X_p[m]$ has an edge roughly in the center.

Here, the coefficient Lu and the bit period Tb, which represents the bit time interval of the signal under measurement 12, are used to express Tu as Tu=Lu·Tb. If Lu=1, for example, Tu may be equal to the bit period Tb representing the bit time interval of the signal under measurement 12, and Tu is desirably chosen to be a value such that Tu/Te is equal to a positive integer. It is desirable that Lu be a positive integer. The ordinal rank of a certain unit-interval waveform $X_p[m]$ in the plurality of unit-interval waveforms $X_p[m]$ is represented by p. For example, the number Nu of unit-interval waveforms $X_p[m]$ included in the sampled signal under measurement 12 is used to express p as an integer from 1 to Nu. The number Nu may be greater than N, depending on the sampling period of the signal under measurement 12.

The ordinal rank of the sample values of the unit-interval waveforms $X_p[m]$ is represented by m. Hereinafter, m is sometimes referred to as the "ordinal rank after division". The relation between the ordinal rank after division m and the reconfigured ordinal rank i is shown by Expression 3. In Expression 3, Tu/Te represents the number of sample values included in each unit-interval waveform $X_p[m]$. The ordinal rank after division m is represented by an integer from 0 to (Tu/Te)−1.

$$m = i \bmod(Tu/Te) = i \bmod(N \cdot Tu/T) \quad \text{Expression 3}$$

The unit-interval waveform group selecting section 204 may generate a unit-interval waveform group by selecting unit-interval waveforms $X_p[m]$ having a prescribed feature from among the plurality of unit-interval waveforms $X_p[m]$ generated by the unit-interval waveform generating section 202 dividing the reconfigured waveform $X_R[i]$. For example, the unit-interval waveform group selecting section 204 selects only the unit-interval waveforms $X_p[m]$ having a rising edge or only the unit-interval waveforms $X_p[m]$ having a falling edge. If the ADC with a 1-bit resolution is used, the unit-interval waveform group selecting section 204 may select the unit-interval waveforms $X_p[m]$ having a rising edge by selecting only the unit-interval waveforms $X_p[m]$ in which the first sample value is logic L. In the same manner, the unit-interval waveform group selecting section 204 may select the unit-interval waveforms $X_p[m]$ having a falling edge by selecting only the unit-interval waveforms $X_p[m]$ in which the first sample value is logic H.

The waveform inverting section 206 may invert the unit-interval waveforms $X_p[m]$ generated by the unit-interval waveform generating section 202. By doing this, the waveform inverting section 206 can invert the unit-interval waveforms $X_p[m]$ having falling edges to be unit-interval waveforms $X_p[m]$ having rising edges. It should be noted that the edge timing of the edges in the unit-interval waveforms $X_p[m]$ does not change even when the unit-interval waveform group selecting section 204 inverts the unit-interval waveforms $X_p[m]$.

The aggregate value calculating section 208 adds the sample values of identical phases in the plurality of unit-interval waveforms $X_p[m]$ to obtain an aggregate value for each phase. For example, the aggregate value calculating section 208 may calculate the aggregate value at each ordinal rank after division m by adding together the sample values at each of the ordinal ranks after division m, which has a relation to the reconfigured ordinal ranks i as expressed by m=i mod (N·Tu/T), included in the unit-interval waveform $X_p[m]$. The aggregate value calculating section 208 may add the sample values of the unit-interval waveforms $X_p[m]$ having rising edges and the inverted sample values of the unit-interval waveforms $X_p[m]$ having falling edges that are inverted by the waveform inverting section 206. The aggregate value calculating section 208 may instead add the sample values of the unit-interval waveforms $X_p[m]$ having falling edges and the inverted sample values of the unit-interval waveforms $X_p[m]$ having rising edges that are inverted by the waveform inverting section 206.

The aggregate value calculating section 208 may instead add only the sample values of the unit-interval waveforms $X_p[m]$ having rising edges, or may add only the sample values of the unit-interval waveforms $X_p[m]$ having falling edges. For example, the jitter of the rising edges and of the falling edges is different if the signal under measurement 12 is a clock signal with a duty ratio other than 50%. Even if the signal under measurement 12 is such a signal, the rise/fall time measurement apparatus 100 described above can accurately measure the rise time or the fall time in both the falling edges and the rising edges respectively.

The difference calculating section 210 calculates the difference between two aggregate values in adjacent phases. For example, the difference calculating section 210 calculates, for each ordinal rank after division m, the difference between an aggregate value of the plurality of unit-interval waveforms $X_p[m]$ at the ordinal rank after division m and the aggregate value at an adjacent ordinal rank after division. The distribution generating section 144 generates the timing distribution based on the differences calculated by the difference calculating section 210. For example, the distribution generating section 144 may generate the edge timing distribution in which the differences calculated by the difference calculating section 210 are associated with the ordinal rank after division m.

Figure 3:
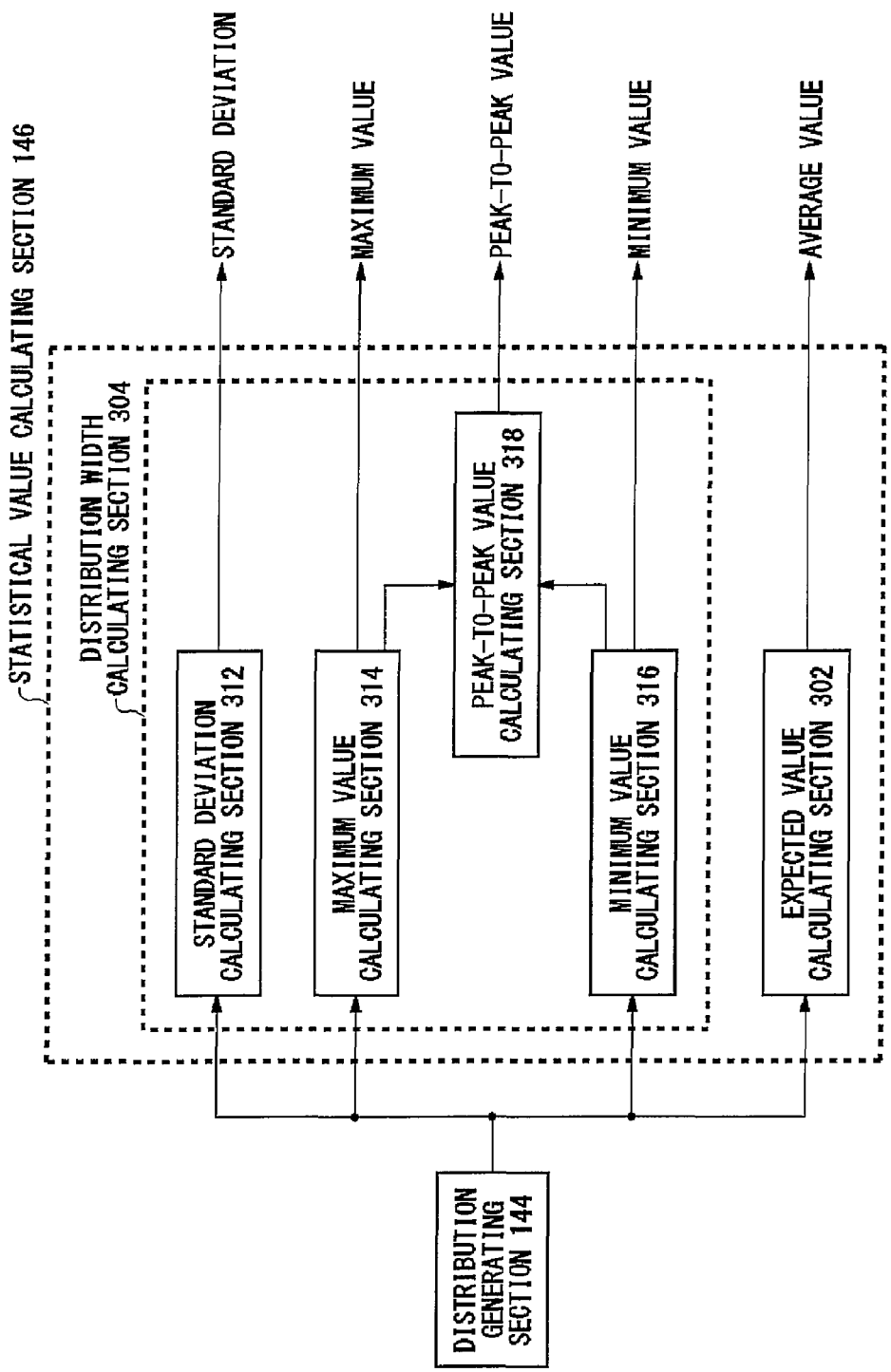
FIG. 3 shows an exemplary configuration of a statistical value calculating section 146.

FIG. 3 is a block diagram showing an exemplary configuration of the statistical value calculating section 146. The statistical value calculating section 146 calculates the statistical value of the edge timing distribution generated by the distribution generating section 144. The statistical value calculating section 146 may have an expected value calculating section 302 and a distribution width calculating section 304. The expected value calculating section 302 may calculate the expected value of the edge timing distribution. The expected value of the edge timing distribution is an average value, for example.

The distribution width calculating section 304 may calculate the distribution width of the edge timing distribution. By doing this, the distribution width calculating section 304 can calculate the width of the fluctuation of the edge timing distribution on the time axis. The distribution width calculating section 304 may calculate this distribution width as the jitter. The distribution width calculating section 304 may have a standard deviation calculating section 312, a maximum value calculating section 314, a minimum value calculating section 316, and a peak-to-peak calculating section 318. The standard deviation calculating section 312 calculates the standard deviation of the edge timing distribution, as an example of the distribution width. The maximum value calculating section 314 calculates the maximum value of the edge timing distribution, as an example of the distribution width. The minimum value calculating section 316 calculates the minimum value of the edge timing distribution, as an example of the distribution width. The peak-to-peak calculating section 318 may calculate the peak-to-peak value, which is an example of the distribution width. The peak-to-peak calculating section 318 may calculate the peak-to-peak value by subtracting the minimum value calculated by the minimum value calculating section 316 from the maximum value calculated by the maximum value calculating section 314.

By adopting the configuration described above, the waveform processing section 140 can generate the edge timing of the signal under measurement 12 based on the sampled input waveform $X_S[k]$. The waveform processing section 140 can also calculate the statistical value of the edge timing distribution by calculating the statistical value of the generated edge timing distribution. The following is a detailed description of the performances of the waveform reconfiguring section 142, the distribution generating section 144, and the statistical value calculating section 146 in the waveform processing section 140.

Figure 4:
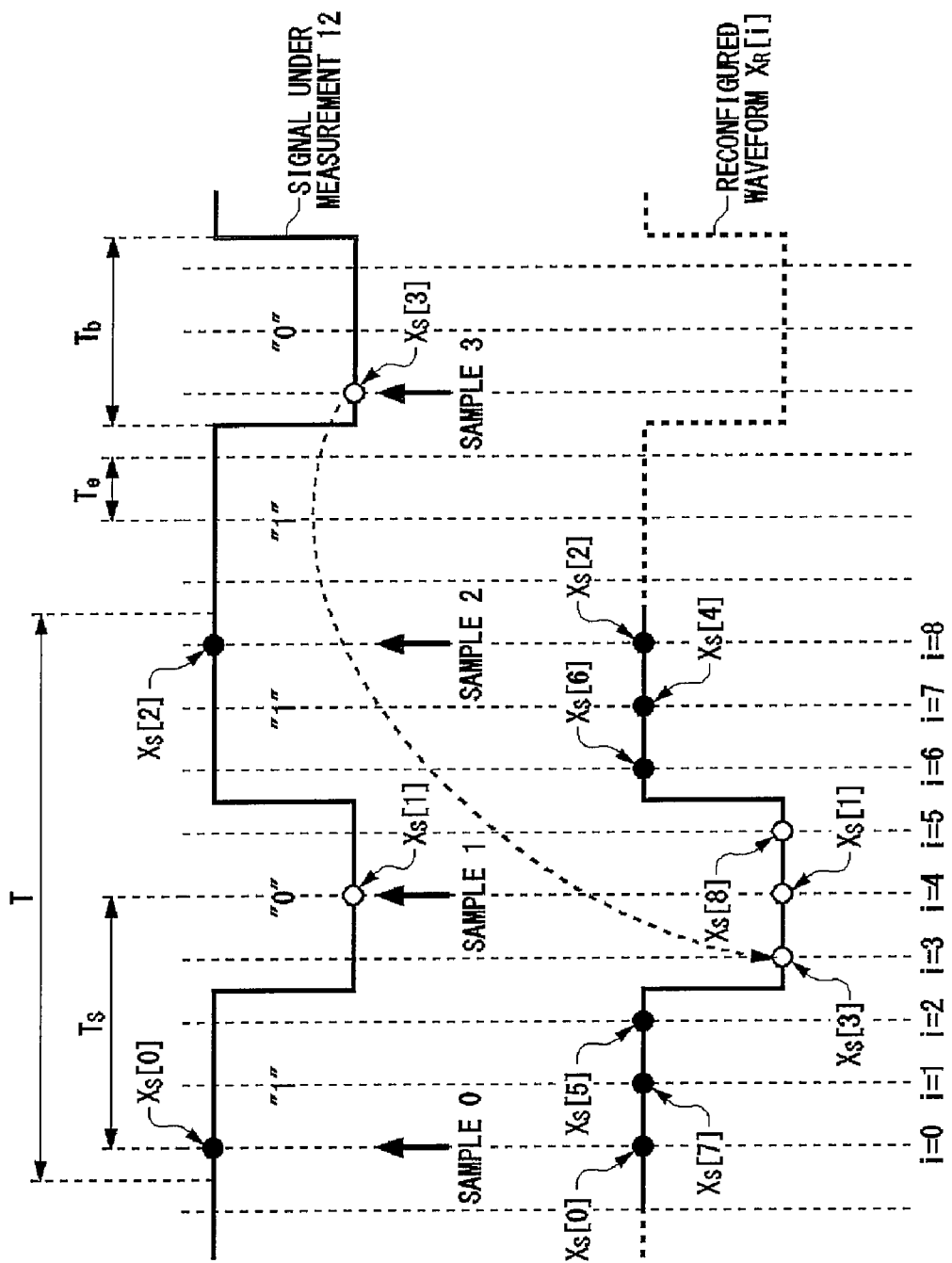
FIG. 4 shows a method for shaping the reconfigured waveform.

FIG. 4 shows a method by which the waveform reconfiguring section 142 shapes the reconfigured waveform. FIG. 4 describes the basics of the process performed by the waveform reconfiguring section 142 when the signal under measurement 12 is a 3-bit data signal having a data sequence "101". In FIG. 4, the thick line near the top represents the signal under measurement 12, the thick line at the bottom represents the reconfigured waveform $X_R[i]$, the white circles represent logic L, and the black circles represent logic H. The signal under measurement 12 that is used is a data signal in which the bit period is Tb and the repeating cycle L of the data pattern is 3 bits. The sampling section 110 samples the signal under measurement 12 in synchronization with the repeating period of the signal under measurement 12 with a sampling frequency Ts that is less than the Nyquist frequency. The equivalent sampling time intervals Te are set equal to Tb/3, and the sampling cycle Ts is set equal to 4Te. Here, N=9, M=4, and M and N are coprime.

In FIG. 4, sample 0 represents the point at which the sampling begins, that is, the sampling occurring at the timing k=0. As shown in FIG. 4, the sample value of the input waveform $X_S[0]$ at sample 0 was logic H. Sample 1 represents the point reached after the time Ts has passed since sample 0, that is, the sampling occurring at the timing k=1. The sample value of the input waveform $X_S[1]$ at sample 1 was logic L. The input waveform $X_S[k]$ was obtained by sampling the signal under measurement 12 at the timings k=0 to k=8 in the same manner described above.

The sample values of the input waveform $X_S[k]$ obtained by the sampling section 110 through the sampling described above are arranged according to the initial ordinal rank k as sampled by the sampling section 110. The waveform reconfiguring section 142 obtains the reconfigured waveform $X_R[i]$ having the cycle T by rearranging the order of the sample values to have the rearranged ordinal rank i. The reconfigured ordinal rank i is obtained from Expression 1. For example, the i corresponding to k=3 is i=(3·4) mod 9=3. Specifically, the sample value sampled at a time when 3Ts has passed since initiation of the sampling is treated in the reconfigured waveform $X_R[i]$ as a sample value sampled at a time when 3Te has passed since initiation of the sampling. The waveform reconfiguring section 142 obtains the reconfigured waveform $X_R[i]$ by rearranging the sample values from k=0 to k=8 in the same manner.

Figure 5:
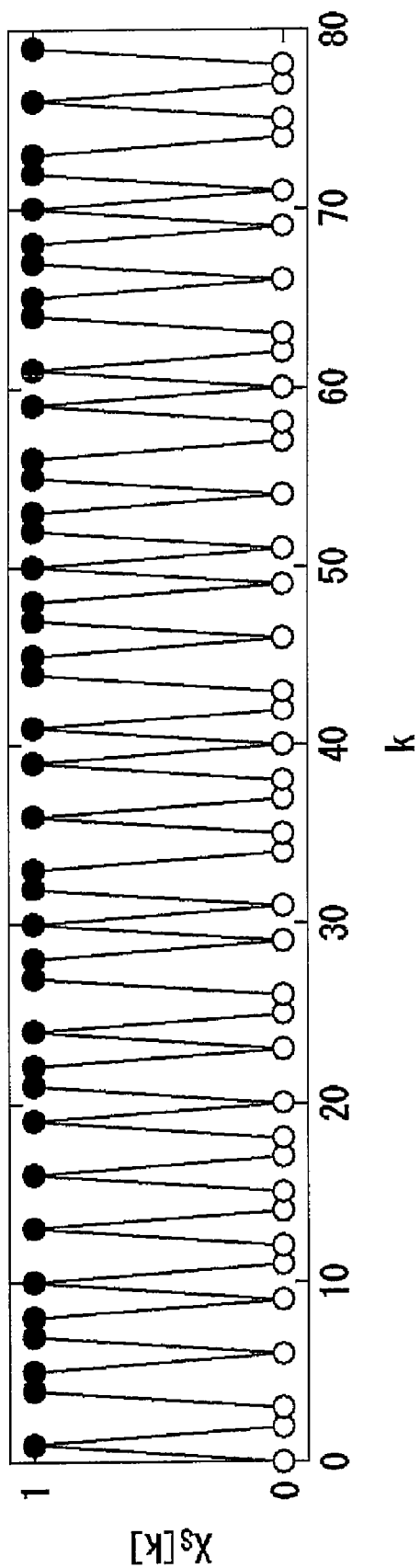
FIG. 5 shows exemplary sample values of an input waveform $X_S[k]$.

FIG. 5 shows exemplary sample values of the input waveform $X_S[k]$. FIG. 5 shows an example of the results of a different sampling in which an ADC with a 1-bit resolution samples the signal under measurement 12. In FIG. 5, the signal under measurement 12 is a clock pattern. The sampling frequency Ts may be set to be more than or less than the Nyquist frequency and M and N are set to be coprime. As shown in FIG. 5, 80 samples are performed from k=0 to k=79. The following describes the processes performed by the distribution generating section 144 and the statistical value calculating section 146 using the input waveform $X_S[k]$ of FIG. 5 as an example.

Figure 6:
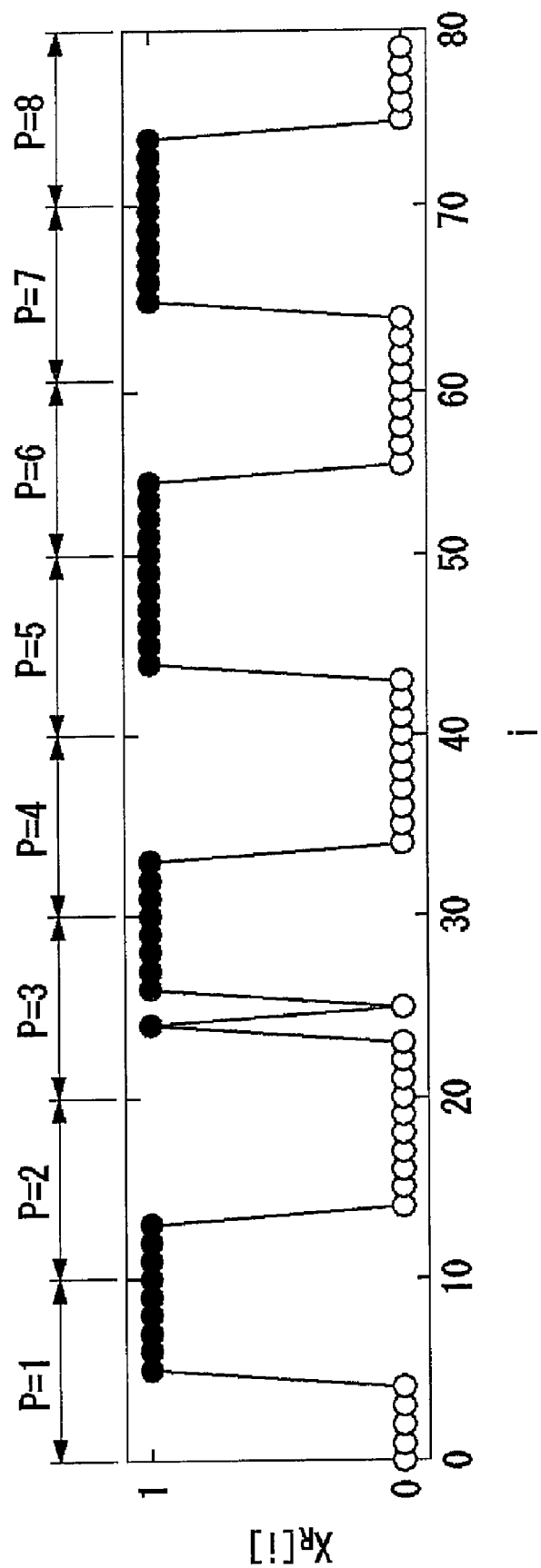
FIG. 6 shows an example of a reconfigured waveform of the signal under measurement 12.

FIG. 6 shows an example of the reconfigured waveform $X_R[i]$ obtained by reconfiguring the input waveform $X_S[k]$ of FIG. 5. The reconfigured waveform $X_R[i]$ has 80 sample values from i=0 to i=79, and the interval between sample values is expressed by the equivalent sampling time interval Te. In the reconfigured waveform $X_R[i]$, the bit period Tb is set equal to the unit interval Tu, so that the unit-interval waveform $X_p[m]$ repeats eight times.

Figure 7:
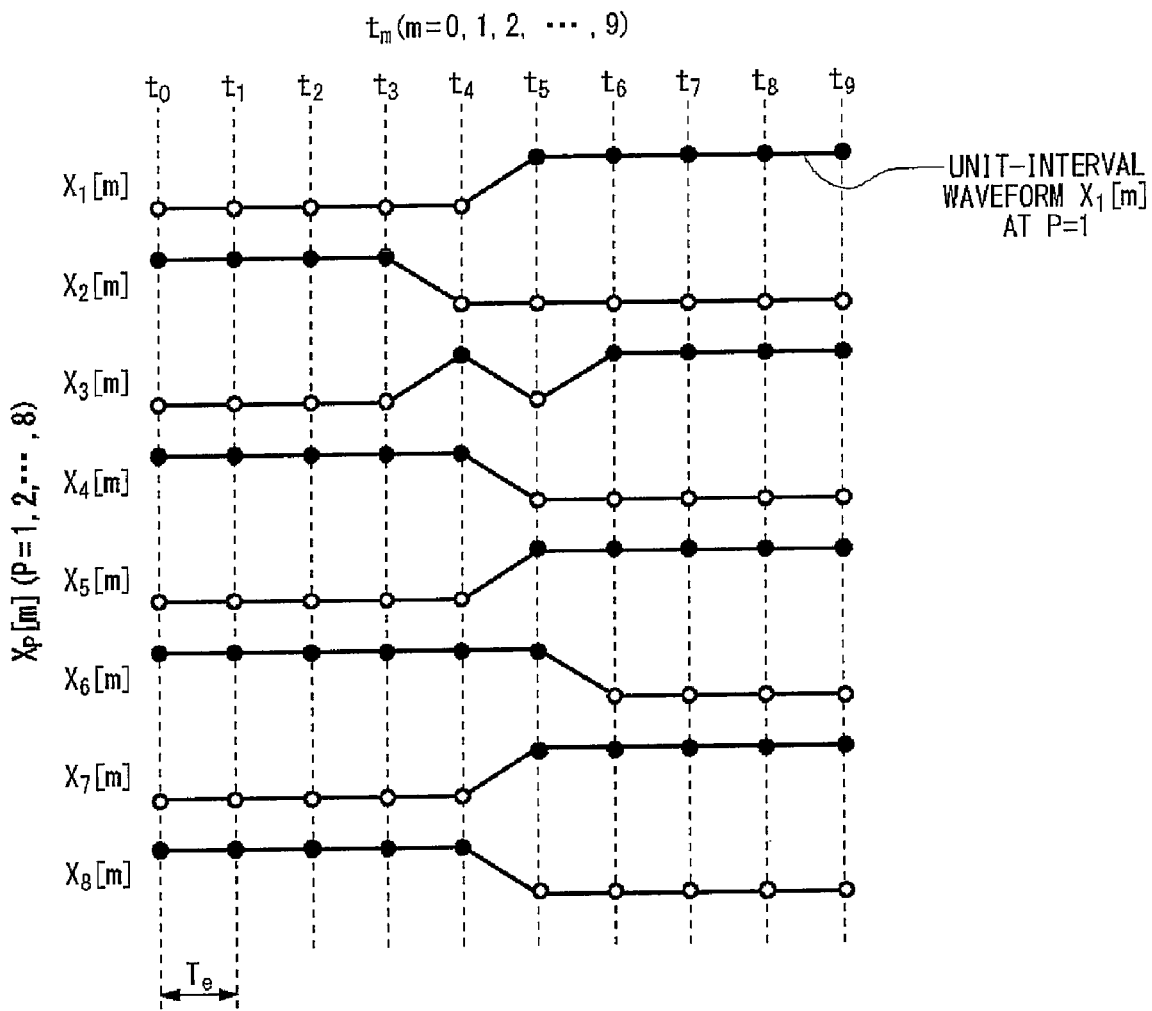
FIG. 7 shows an example of the unit-interval waveforms in the signal under measurement 12.

FIG. 7 shows an example of the unit-interval waveform $X_p[m]$ included in the reconfigured waveform $X_R[i]$ of FIG. 6. FIG. 7 is used to describe the general process performed by the unit-interval waveform generating section 202. When the bit period Tb is set equal to the unit interval Tu and the reconfigured waveform $X_R[i]$ is divided into a plurality of unit intervals Tu, eight unit-interval waveforms $X_p[m]$ are obtained from p=1 to p=8. As shown in FIG. 7, each unit-interval waveform $X_p[m]$ includes ten sample values from m=0 to m=9. The unit-interval waveforms $X_p[m]$ at p=1, 3, 5, 7 have rising edges, and the unit-interval waveforms $X_p[m]$ at p=2, 4, 6, 8 have falling edges.

Figure 8:
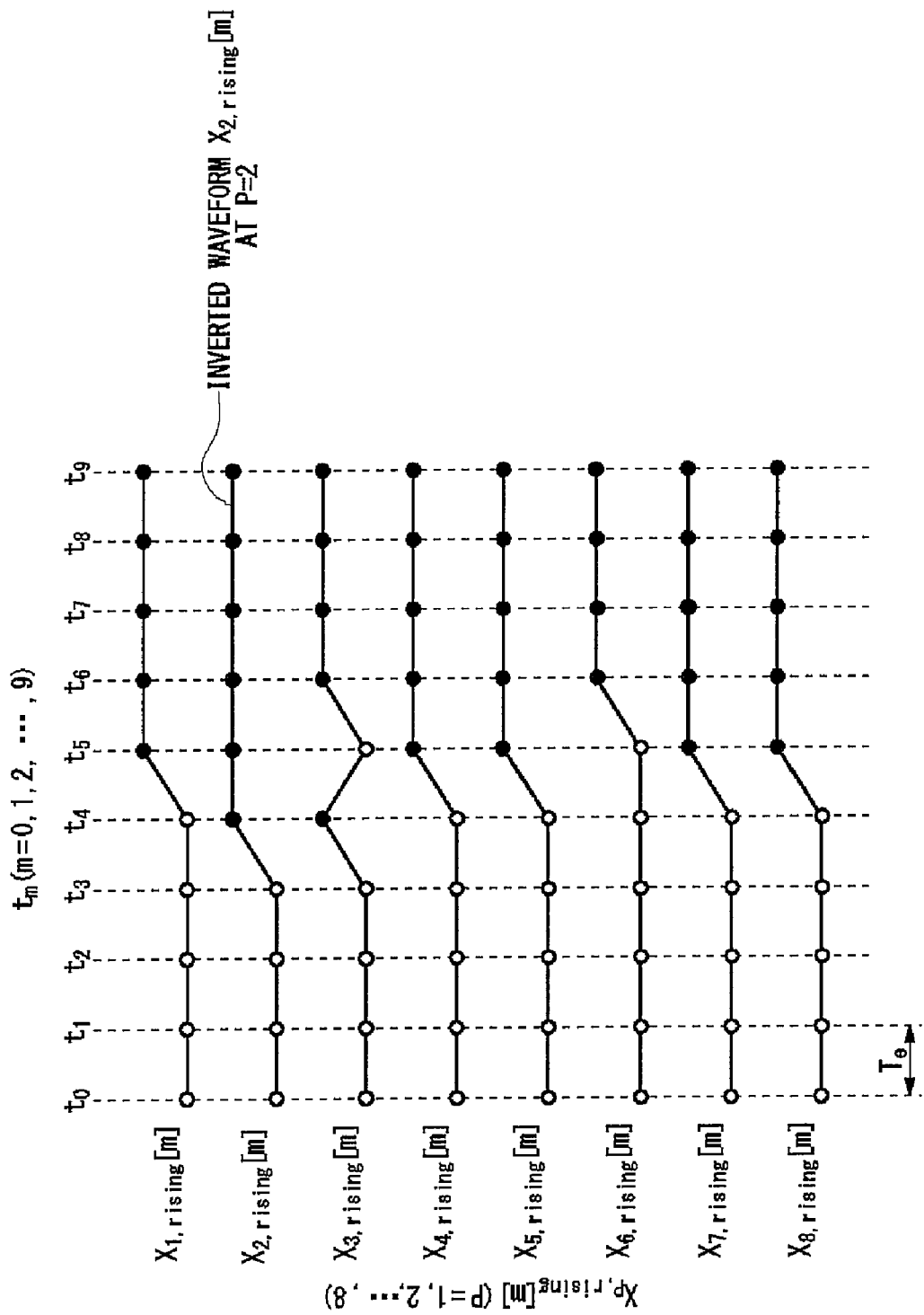
FIG. 8 shows an example in which a portion of the unit-interval waveforms in the signal under measurement 12 are inverted.

FIG. 8 shows an example in which a portion of the unit-interval waveforms shown in FIG. 7 are inverted. FIG. 8 is used to describe the general processes performed by the unit-interval waveform group selecting section 204 and the waveform inverting section 206. The unit-interval waveform group selecting section 204 selects only the unit-interval waveforms $X_p[m]$ having falling edges in FIG. 7. The waveform inverting section 206 inverts the logic values of the unit-interval waveforms $X_p[m]$ selected by the unit-interval waveform group selecting section 204 to obtain inverted waveforms $X_{p,\,rising}[m]$. In this way, the inverted waveforms $X_{p,\,rising}[m]$ of FIG. 8 all have rising edges. The unit-interval waveform group selecting section 204 may instead select only the unit-interval waveforms $X_p[m]$ having rising edges, and the waveform inverting section 206 may invert the logic values of these unit-interval waveforms $X_p[m]$ so that all of the inverted waveforms have falling edges.

Figure 9:
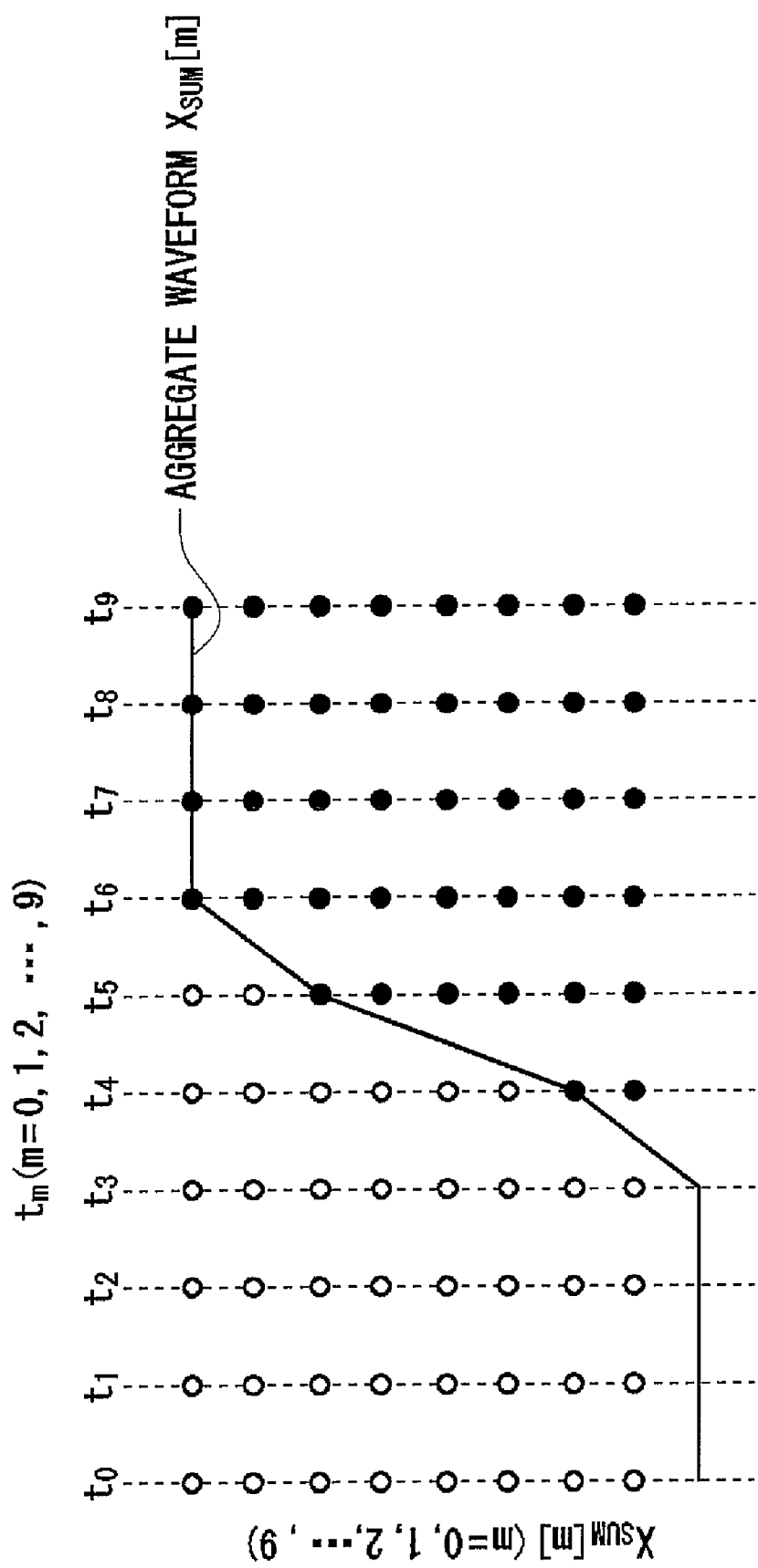
FIG. 9 shows an example of an aggregate waveform obtained by adding together the unit-interval waveforms in the signal under measurement 12.

FIG. 9 shows an example of an aggregate waveform $X_{SUM}[m]$ obtained by adding the unit-interval waveforms of FIG. 8 together. FIG. 9 is used to describe the general process performed by the aggregate value calculating section 208. The aggregate waveform $X_{SUM}[m]$ can be obtained by adding together the logic values of the inverted waveforms $X_{p,\,rising}[m]$ from p=1 to p=8 at each ordinal rank after division m and calculating the aggregate value at each ordinal rank after division m, for example. In FIG. 9, the aggregate values from $X_{SUM}[0]$ to $X_{SUM}[3]$ are 0, the aggregate value of $X_{SUM}[4]$ is 2, the aggregate value of $X_{SUM}[5]$ is 6, the aggregate values of $X_{SUM}[6]$ to $X_{SUM}[9]$ are 8. From this, it is understood that the edge timing is between m=3 and m=6. It should be noted that since the sample values are expressed as binary logic values when the ADC with a 1-bit resolution is used, the aggregate value is equivalent to a count value of logic H.

Figure 10:
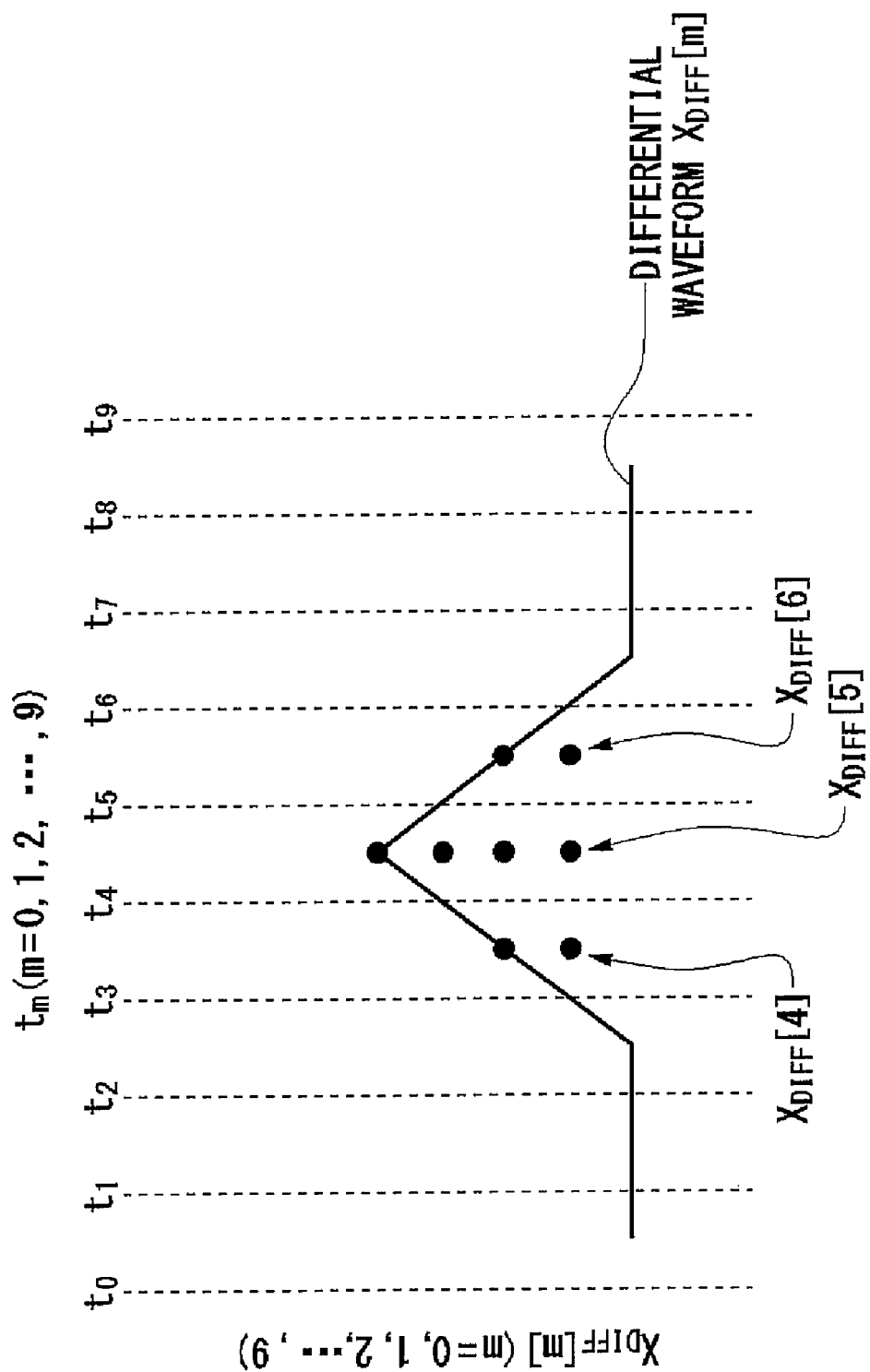
FIG. 10 shows an example of a differential waveform obtained by differentiating the aggregate waveform.

FIG. 10 shows an example of a differential waveform $X_{DIFF}[m]$ obtained by differentiating the aggregate waveform $X_{SUM}[m]$. FIG. 10 is used to describe the general process of the difference calculating section 210. The differential waveform $X_{DIFF}[m]$ is obtained by calculating the differences between the aggregate values of the aggregate waveform $X_{SUM}[m]$ at each ordinal rank m and the aggregate values of the aggregate waveform $X_{SUM}[m-1]$ at each ordinal rank m−1 adjacent to a certain ordinal rank m, for example. The differential waveform $X_{DIFF}[m]$ is an example of the edge timing distribution. As shown in FIG. 10, the waveform $X_{DIFF}[4]$ at m=4 is 2, the waveform $X_{DIFF}[5]$ at m=5 is 4, waveform $X_{DIFF}[6]$ at m=6 is 2, and the values of $X_{DIFF}[m]$ at the other ordinal ranks after division m are 0. From this, it is understood that the edge timing is between m=3 and m=6.

Figure 11:
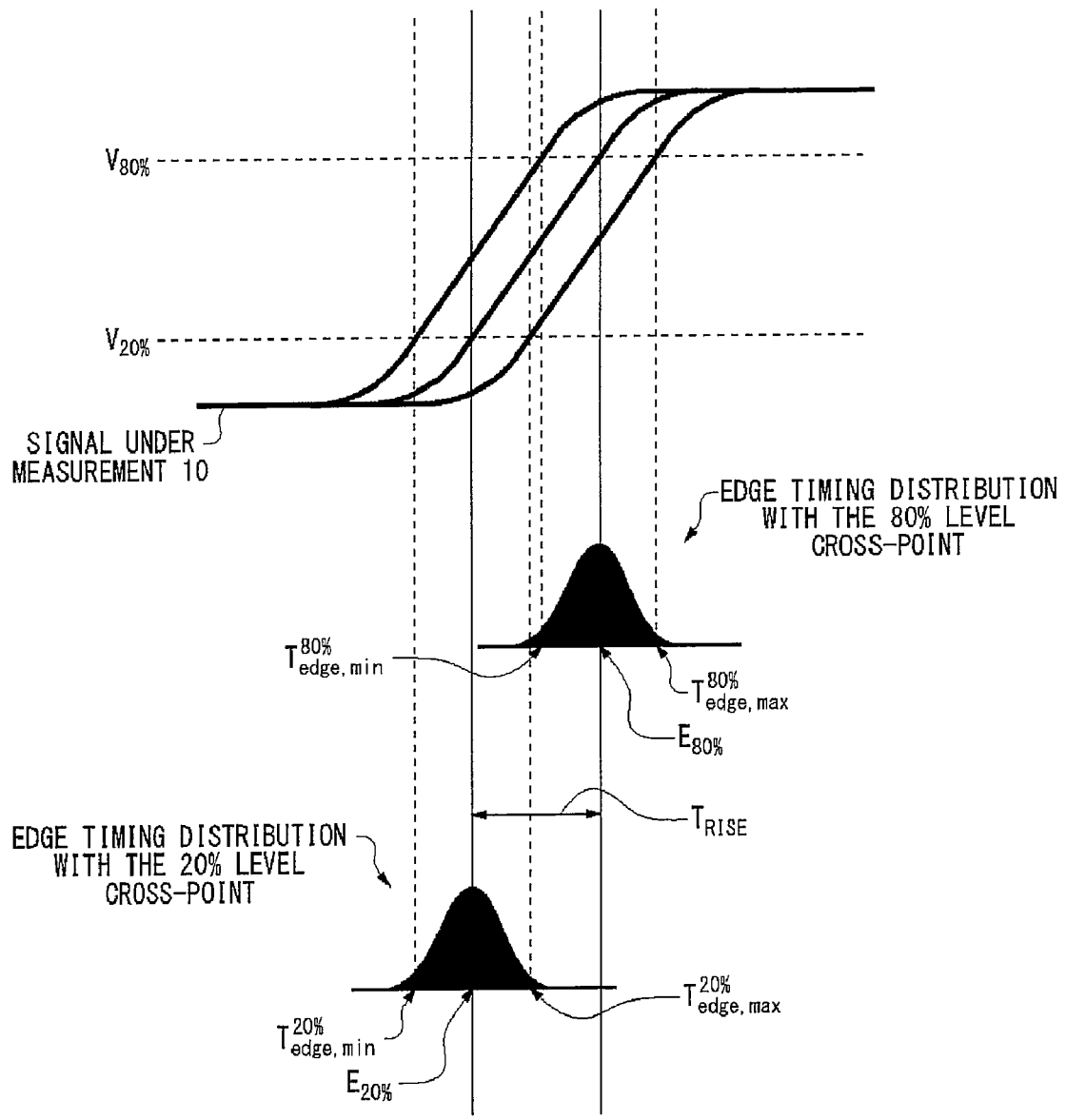
FIG. 11 shows an example of an edge timing distribution.

FIG. 11 shows an example of an edge timing distribution obtained when the threshold value of the sampling section 110 corresponds to the 80% level cross-point of the signal under measurement 10 and the threshold value of the sampling section 112 corresponds to the 20% level cross-point of the signal under measurement 10. FIG. 11 is used to describe the process performed by the statistical value calculating section 146. The statistical value calculating section 146 may use Expression 4 to calculate an average value E of the edge timing distribution of the signal under measurement 10 based on the differential waveform $X_{DIFF}[m]$. By doing this, the statistical value calculating section 146 can obtain the average value $E_{80\%}$ of the edge timing of the signal under measurement 12 and the average value $E_{20\%}$ of the edge timing of the signal under measurement 14. In Expression 4, $t_m$ represents a sampling time of the signal under measurement 12 or the signal under measurement 14, and is expressed by $t_m = m \cdot Te$. Furthermore, $\max(X_{SUM}[m])$ represents the maximum value of $X_{SUM}[m]$.

$$E = \sum_{m=0}^{\frac{Tu}{Te}-1} t_m \cdot \frac{X_{DIFF}[m]}{\max(X_{sum}[m])} \quad \text{Expression 4}$$

The statistical value calculating section 146 may use Expression 5 to calculate the standard deviation $TJ_{RMS}$. The statistical value calculating section 146 may calculate the maximum value $T_{edge, max}$ and the minimum value $T_{edge, min}$ of the edge timing distribution. The maximum value $T_{edge, max}$ may be calculated as the maximum time $t_m$ at which $X_{DIFF}[m]$ is not zero. The minimum value $T_{edge, min}$ may be calculated as the minimum time $t_m$ at which $X_{DIFF}[m]$ is not zero. In FIG. 11, $T^{80\%}_{edge, max}$ represents the maximum value of the edge timing distribution of the signal under measurement 12, $T^{20\%}_{edge, max}$ represents the maximum value of the edge timing distribution of the signal under measurement 14, $T^{80\%}_{edge, min}$ represents the minimum value of the edge timing distribution of the signal under measurement 12 and $T^{20\%}_{edge, min}$ represents the minimum value of the edge timing distribution of the signal under measurement 14.

The statistical value calculating section 146 may use Expression 6 to calculate a peak-to-peak value $TJ_{PP}$. In Expression 6, $\max(t_m | x_{DIFF} \neq 0)$ represents the maximum time $t_m$ at which $X_{DIFF}[m]$ is not zero, and $\min(t_m | x_{DIFF} \neq 0)$ represents the minimum time $t_m$ at which $X_{DIFF}[m]$ is not zero.

$$TJ_{RMS} = \sqrt{\sum_{m=0}^{\frac{Tu}{Te}-1} \left\{ (t_m - E)^2 \cdot \frac{X_{DIFF}[m]}{\max(X_{sum}[m])} \right\}} \quad \text{Expression 5}$$

$$TJ_{PP} = T_{edge,max} - T_{edge,min} \quad \text{Expression 6}$$
$$TJ_{PP} = \max(t_m | x_{DIFF} \neq 0) - \min(t_m | x_{DIFF} \neq 0)$$

The following uses FIG. 11 to describe the general process performed by the rise/fall time calculating section 150. The following describes an example of calculating the rise time $T_{RISE}$ of the signal under measurement 10, but the fall time can be calculated in the same manner. The rise/fall time calculating section 150 may obtain the rise time $T_{RISE}$ of the signal under measurement 10 by calculating the difference between the average value $E_{80\%}$ of the edge timing of the signal under measurement 12 and the average value $E_{20\%}$ of the edge timing of the signal under measurement 14, or the absolute value of this difference.

The rise/fall time calculating section 150 may calculate the maximum values or the minimum values of the timing distribution ends of the signal under measurement 12 and the signal under measurement 14. For example, the rise/fall time calculating section 150 uses Expression 7 to obtain the rise time $T_{RISE, max}$ from the maximum difference between the timing distribution ends. In Expression 7, $\max(T^{80\%}_{edge, max}, T^{20\%}_{edge, max})$ represents the greater of the two values $T^{80\%}_{edge, max}$ and $T^{20\%}_{edge, max}$, and $\min(T^{80\%}_{edge, min}, T^{20\%}_{edge, min})$ represents the lesser of the two values $T^{80\%}_{edge, min}$ and $T^{20\%}_{edge, min}$.

$$T_{RISE,max} = \max(T^{80\%}_{edge,max}, T^{20\%}_{edge,max}) - \min(T^{80\%}_{edge,max}, T^{20\%}_{edge,max}) \quad \text{Expression 7}$$

The rise/fall time calculating section 150 may calculate the rise time $T_{RISE}$ as the difference between any one of the average value, the minimum value, or the maximum value of the edge timing distribution of the signal under measurement 12 and any one of the average value, the minimum value, or the maximum value of the edge timing distribution of the signal under measurement 14. For example, the rise/fall time calculating section 150 may calculate the rise time $T_{RISE}$ to be the difference between $E_{80\%}$ and $T^{20\%}_{edge, max}$. FIGS. 5 to 11 described the operation of the rise/fall time evaluating section 130 with regards to a clock signal, but the operation of the rise/fall time evaluating section 130 is not limited to a clock signal. The rise/fall time evaluating section 130 can calculate the rise time or the fall time in the same manner for other types of periodic signals.

Figure 12:
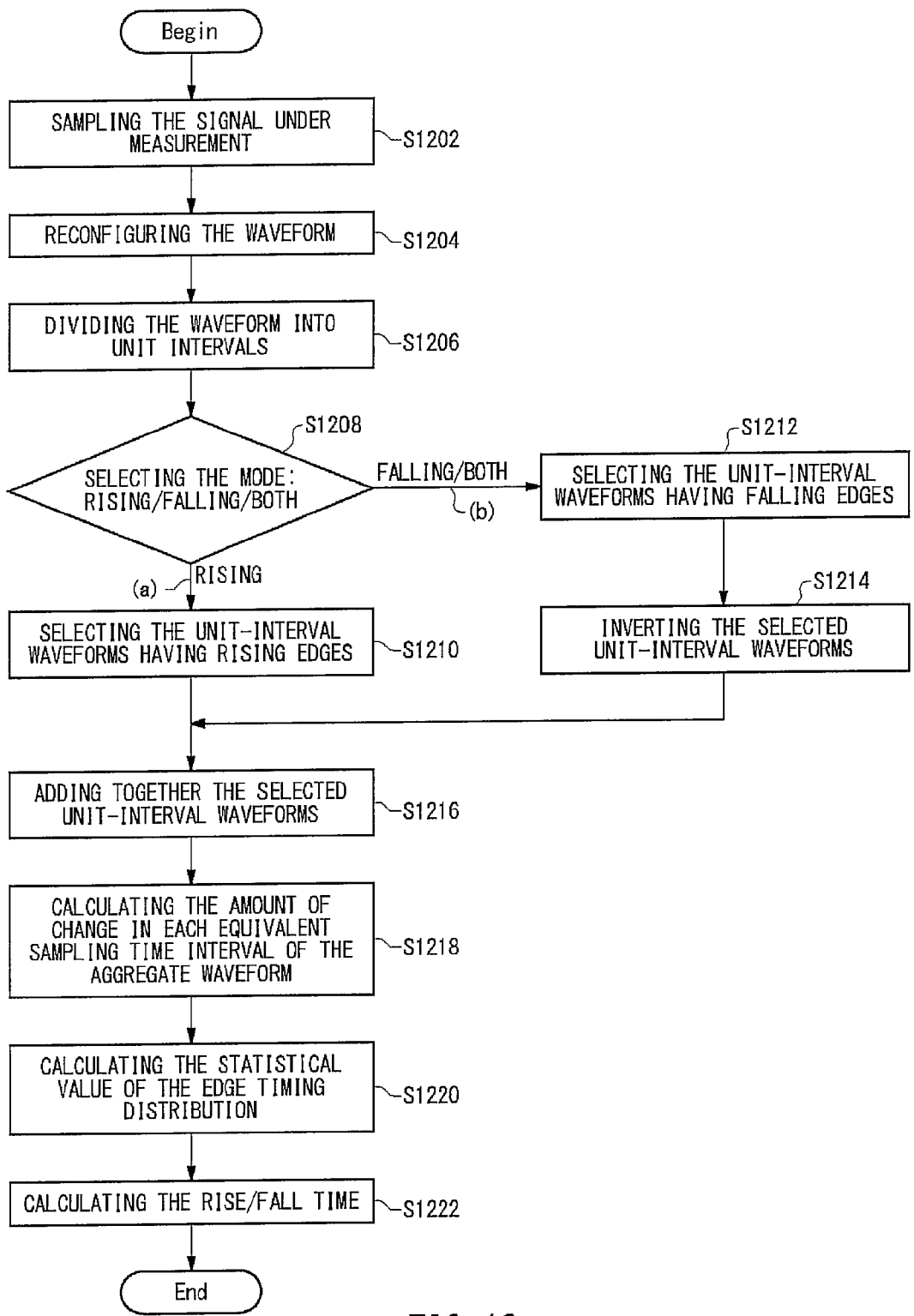
FIG. 12 shows the order of the process performed by the rise/fall time measurement apparatus 100.

FIG. 12 is a flow chart showing the order of the process performed by the rise/fall time measurement apparatus 100. FIG. 12 is used to describe the performance of the rise/fall time measurement apparatus 100. At S1202, the sampling section 110 samples the signal under measurement 12 and the signal under measurement 14 having a cycle T to obtain the sample values of the input waveforms $X_S[k]$ corresponding to the signal under measurement 12 and the signal under measurement 14 respectively. The sampling section 110 samples the signal under measurement 12 with a condition that the sampling is performed N times while the signal under measurement 12 repeats for M cycles, where M and N are coprime. The signal under measurement 14 is sampled under the same condition. The signal under measurement 12 and the signal under measurement 14 are desirably sampled at substantially the same time and with substantially the same sampling frequency Ts. The thus obtained sample values may be stored in the memory 120. The process described hereinafter from S1204 to S1220 is applied to the respective input waveforms $X_S[k]$ of the signal under measurement 12 and the signal under measurement 14.

At S1204, the waveform reconfiguring section 142 reconfigures the input waveform $X_S[k]$ to generate the reconfigured waveform $X_R[i]$. The waveform reconfiguring section 142 may reconfigure the input waveform $X_S[k]$ by acquiring the sample values stored in the memory 120 and rearranging the initial ordinal ranks k to be the reconfigured ordinal ranks i using the calculation $i = (k \cdot M) \mod N$. At S1206, the unit-interval waveform generating section 202 divides the reconfigured waveform $X_R[i]$ into unit intervals Tu to obtain a plurality of unit-interval waveforms $X_p[m]$.

At S1208, a target is selected for calculating the edge timing distribution from among the plurality of unit-interval waveforms $X_p[m]$ obtained at S1206. The selection mode may be a mode for selecting only the unit-interval waveforms $X_p[m]$ having rising edges, a mode for selecting only the unit-interval waveforms $X_p[m]$ having falling edges, or a mode for selecting all of the unit-interval waveforms $X_p[m]$.

If the mode used at S1208 is a mode selecting only the unit-interval waveforms $X_p[m]$ having rising edges ((a) at S1208), the unit-interval waveform group selecting section 204 selects only the unit-interval waveforms $X_p[m]$ having rising edges, from among the plurality of unit-interval waveforms $X_p[m]$ obtained at S1206, to generate the unit-interval waveform group at S1210.

On the other hand, if the mode used at S1208 is a mode selecting only the unit-interval waveforms $X_p[m]$ having falling edges or for selecting all of the unit-interval waveforms $X_p[m]$ ((b) at S1208), the unit-interval waveform group selecting section 204 selects only the unit-interval waveforms $X_p[m]$ having falling edges, from among the plurality of unit-interval waveforms $X_p[m]$ obtained at S1206, to generate the unit-interval waveform group at S1212. At S1214, the waveform inverting section 206 inverts the waveform of the group of unit-interval waveforms having falling edges.

At step S1216, the aggregate value calculating section 208 adds the logic values of the unit-interval waveforms $X_p[m]$, which are selected by the unit-interval waveform group selecting section 204 at S1208 according to the mode, at each ordinal rank after division m to obtain the aggregate waveform $X_{SUM}[m]$. At S1218, the difference calculating section 210 differentiates the aggregate waveform $X_{SUM}[m]$ to obtain the differential waveform $X_{DIFF}[m]$. The differential waveform $X_{DIFF}[m]$ can be obtained by calculating the amount of change in the aggregate waveform $X_{SUM}[m]$ for each equivalent sampling time interval Te, for example. The amount of change in the aggregate waveform $X_{SUM}[m]$ can be obtained from the differences between the aggregate values of the aggregate waveform $X_{SUM}[m]$ at each ordinal rank m and the aggregate values of the aggregate waveform $X_{SUM}[m-1]$ at each ordinal rank m−1 adjacent to a certain ordinal rank m, for example.

At S1220, the statistical value calculating section 146 calculates the statistical value of the edge timing distribution based on the differential waveform $X_{DIFF}[m]$ obtained at S1218. The statistical value of the edge timing distribution may be the average value E, the standard deviation $TJ_{RMS}$, the maximum value $T_{edge, max}$, the minimum value $T_{edge, min}$, or the peak-to-peak value $TJ_{PP}$ of the edge timing distribution. At S1222, the rise/fall time calculating section 150 may calculate the difference between the average value $E_{80\%}$ of the edge timing distribution of the signal under measurement 12 and the average value $E_{20\%}$ of the edge timing distribution of the signal under measurement 14. The rise/fall time evaluating section 130 then outputs the rise/fall time calculated by the rise/fall time calculating section 150, and ends the process.

Figure 13:
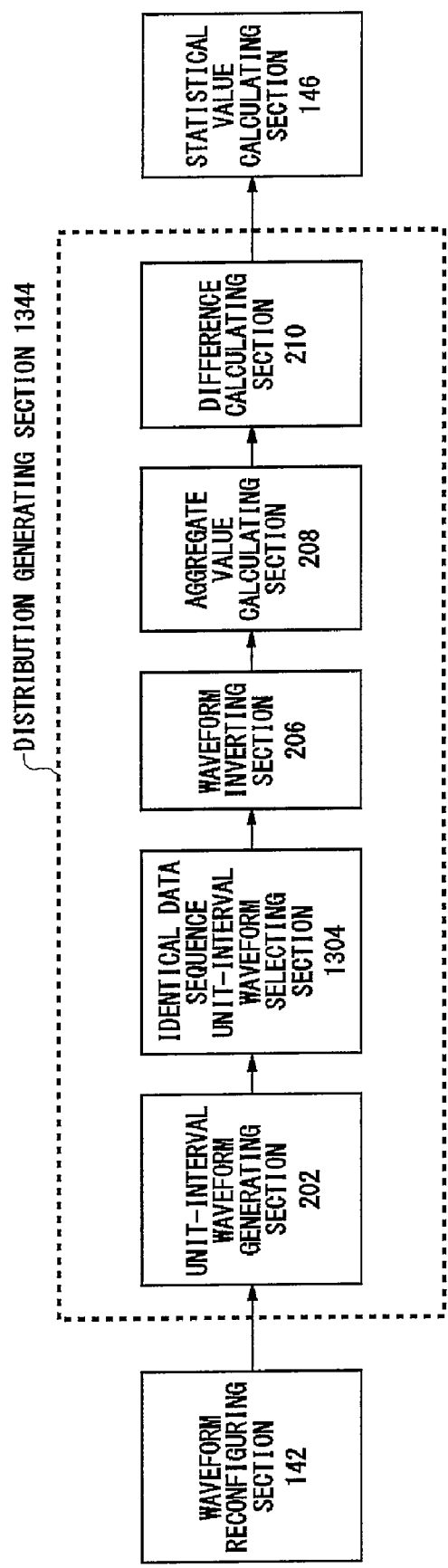
FIG. 13 shows another exemplary configuration of the distribution generating section 144.

FIG. 13 is a block diagram showing another exemplary configuration of the distribution generating section 144. A distribution generating section 1344 has an identical data sequence unit-interval waveform group selecting section 1304 instead of a unit-interval waveform group selecting section 204, but is otherwise identical to the distribution generating section 144. The identical data sequence unit-interval waveform group selecting section 1304 selects a group of unit-interval waveforms having identical data sequences of the sample values in the signal under measurement 12 or the signal under measurement 14 immediately prior thereto, from among the unit-interval waveforms $X_p[m]$ generated by the unit-interval waveform generating section 202. The aggregate value calculating section 208 adds together the logic values of the sample values for each unit-interval waveform in the group selected by the identical data sequence unit-interval waveform group selecting section 1304, instead of for each unit-interval waveform in the group selected by the unit-interval waveform group selecting section 204.

Figure 14:
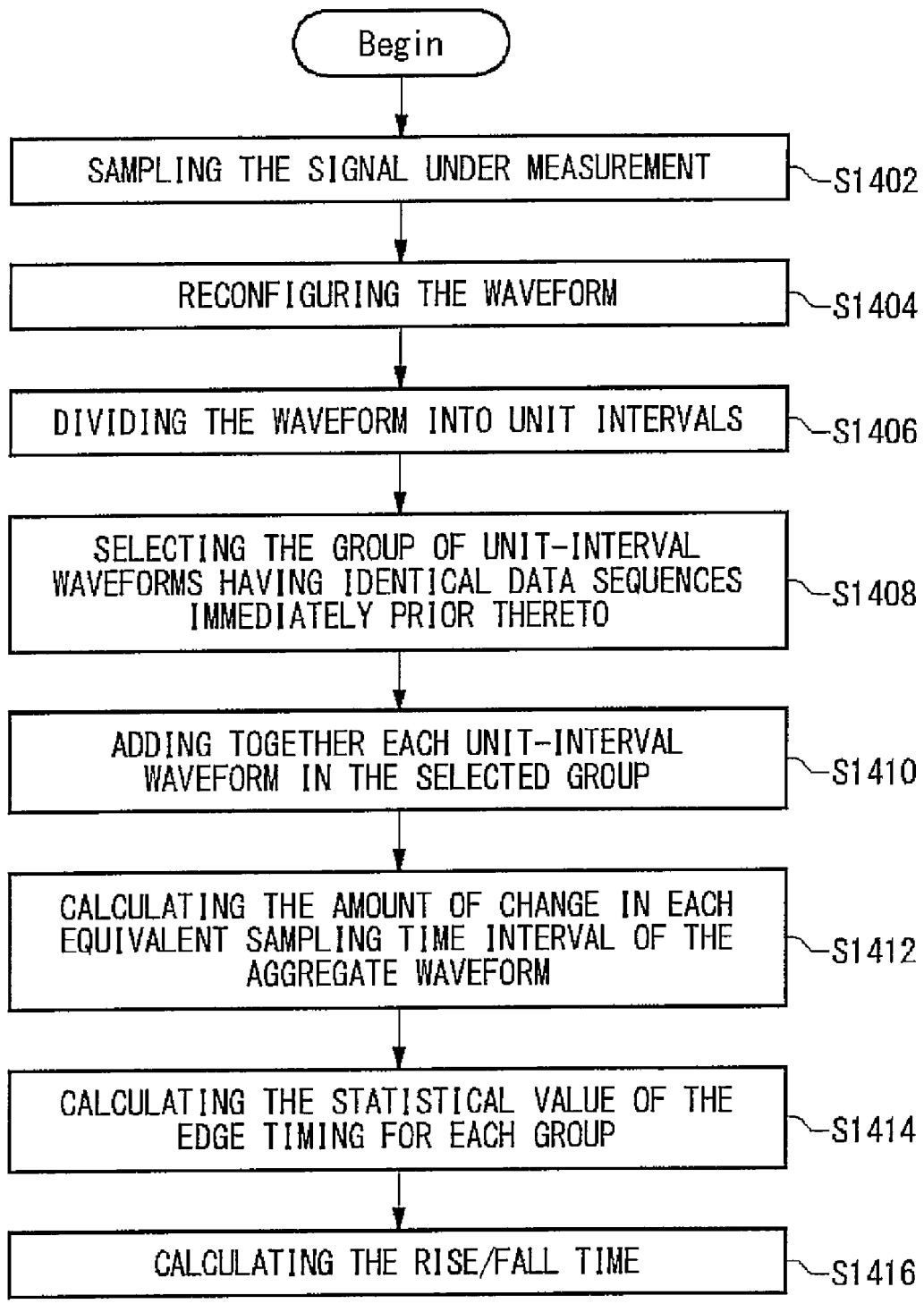
FIG. 14 shows the order of the process performed by another embodiment.

FIG. 14 is a flow chart showing the order of the process performed by the distribution generating section 1344 of FIG. 13. FIG. 14 is used to describe a process of using the identical data sequence unit-interval waveform group selecting section 1304 to calculate the rise/fall time when the signal under measurement 10 repeats an L-bit data pattern. Here, L represents a positive integer. The process from S1402 to S1406 is identical to the process from S1202 to S1206, and therefore a description is omitted. The process from S1410 to S1414 is identical to the process from S1216 to S1220, except for the processing of the identical data sequence unit-interval waveform group selected at S1408, and therefore a description of the identical portions is omitted. The following describes the process performed for the input waveform $X_S[k]$ corresponding to the signal under measurement 12, but the same process from S1402 to S1414 is performed for the input waveform $X_S[k]$ corresponding to the signal under measurement 14.

At S1408 in the present embodiment, the identical data sequence unit-interval waveform group selecting section 1304 generates the group of identical data sequence unit-interval waveforms, each having immediately prior data sequences that are identical to the data sequence immediately prior to the edge being measured. The identical data sequence unit-interval waveform group can be generated as described hereinafter, for example. First, the reconfigured waveform $X_R[i]$ is divided into bit periods. The identical data sequence unit-interval waveform group selecting section 1304 then selects a specific edge to be measured from among the edges in the signal under measurement 12. The identical data sequence unit-interval waveform group selecting section 1304 selects only the unit-interval waveforms having the same data sequence for L-bits immediately prior thereto as that of the specific edge, from among all of the unit-interval waveforms, and extracts the selected unit waveforms. In this way, the data sequence unit-interval waveform group selecting section 1304 can generate the group of identical data sequence unit-interval waveforms, each having immediately prior data sequences that are identical to the data sequence immediately prior to the edge being measured.

From S1410 to S1414, the edge timing distribution and the average value of the edge timing distribution are calculated for each unit-interval waveform included in the identical data sequence unit-interval waveform group obtained at S1304, in the same manner as the process from S1216 to S1220. In this way, the average value of the edge timing of the specific edge can be calculated. The average value of the edge timing for each of the plurality of edges in the signal under measurement 12 can be calculated by the process from S1408 to S1414 as shown above. The process from S1408 to S1414 may be performed for all of the edges in the signal under measurement 12.

At S1416, the rise/fall time calculating section 150 may obtain the rise time or the fall time by calculating the difference between the average value of the edge timing of a specific edge of the signal under measurement 12 and the average value of the edge timing of the corresponding specific edge of the signal under measurement 14 obtained at S1414. The rise/fall time calculating section 150 may obtain the rise time or the fall time through a variety of comparison combinations between any one of the statistical values of the edge timing distribution of the signal under measurement 12 and any one of the statistical values of the edge timing distribution of the signal under measurement 14.

The rise/fall time calculating section 150 may calculate the rise/fall time of a plurality of edges in the signal under measurement 12 and a plurality of edges in the signal under measurement 14 if an edge timing distribution is desired for a plurality of edges. In this way, the rise/fall time calculating section 150 can generate a rise/fall time sequence by arranging the rise/fall times in a time series. The rise/fall time calculating section 150 may obtain the rise/fall time by calculating the statistical value of this rise/fall time sequence. The rise/fall time calculating section 150 may calculate an RMS value as the statistical value. The rise/fall time evaluating section 130 outputs the rise/fall time obtained by the rise/fall time calculating section 150 and ends the process.

The present embodiment describes an example using the identical data sequence unit-interval waveform group selecting section 1304 instead of the unit-interval waveform group selecting section 204, but both the identical data sequence unit-interval waveform group selecting section 1304 and the unit-interval waveform group selecting section 204 may also be used. Instead of the identical data sequence unit-interval waveform group selecting section 1304, a prescribed bit unit-interval waveform group selecting section may be used that selects unit-interval waveforms generated by the unit-interval waveform generating section 202 at prescribed bit intervals in the signal under measurement 12 or the signal under measurement 14. The aggregate value calculating section 208 may add the sample values of the unit-interval waveforms having falling edges that are inverted by the waveform inverting section 206 to the sample values of the unit-interval waveforms having rising edges for each prescribed bit unit-interval waveform in the group selected by the prescribed bit unit-interval waveform group selecting section. Furthermore, the rise/fall time measurement apparatus 100 may include both the prescribed bit unit-interval waveform group selecting section and the unit-interval waveform group selecting section 204.

The above description discloses a signal measurement method including the steps of sampling a signal under measurement having a cycle T with two sampling sections having threshold values that are different from each other, shaping reconfigured waveforms having the cycle T by rearranging the order of the sample values of the signal under measurement corresponding to each threshold value obtained at the sampling step, generating timing distributions of a portion of the edges in the reconfigured waveform of the signal under measurement corresponding to each threshold value, and calculating the rise time or the fall time of the signal under measurement based on the timing distribution of the signal under measurement corresponding to each threshold value. Furthermore, a signal measurement method is disclosed for, at the sampling step described above, sampling the signal under measurement a certain number of times N while the signal under measurement having the cycle T repeats for M cycles, where M and N are coprime. Yet further, a signal measurement method is disclosed for, at the reconfiguring step described above, rearranging the order of the sample values obtained at the sampling step to have reconfigured ordinal ranks i by inputting the initial ordinal ranks k into the expression i=k·M mod N, where k is expressed by integers from 0 to N−1, and using these rearranged sample values to shape reconfigured waveforms having the cycle T.

Figure 15:
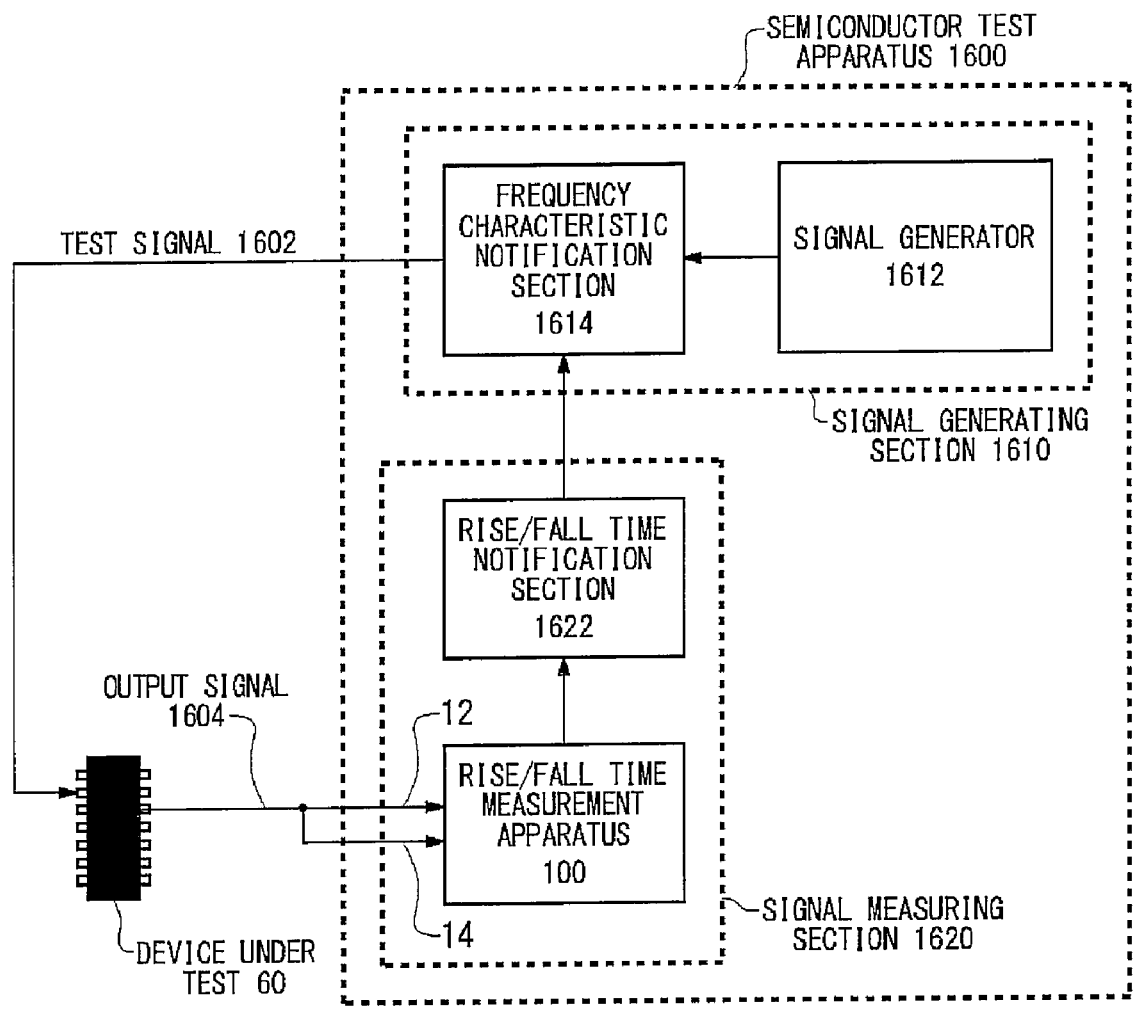
FIG. 15 shows an exemplary configuration of a semiconductor test apparatus 1600.

FIG. 15 is a block diagram showing an exemplary configuration of a semiconductor test apparatus 1600. The semiconductor test apparatus 1600 is an example of a test apparatus. The semiconductor test apparatus 1600 provides a test signal 1602 to a device under test 60 to test the device under test 60. The semiconductor test apparatus 1600 is provided with a signal generating section 1610 and a signal measuring section 1620. The signal generating section 1610 generates the test signal 1602. The signal measuring section 1620 measures an output signal 1604 of the device under test 60. The output signal 1604 has a cycle T. The signal generating section 1610 includes a signal generator 1612 and a frequency characteristic adjusting section 1614. The signal measuring section 1620 includes the rise/fall time measurement apparatus 100 and a rise/fall time notification section 1622.

The signal generator 1612 generates the test signal 1602. The frequency characteristic adjusting section 1614 may adjust the frequency characteristic of the test signal 1602 to decrease the rise/fall time of the output signal 1604 in accordance with the rise/fall time of the output signal 1604 measured by the signal measuring section 1620. The frequency characteristic adjusting section 1614 may adjust the frequency characteristic of the test signal 1602 according to the rise/fall time indicated by notification from the rise/fall time notification section 1622. For example, if the rise/fall indicated by the notification from the rise/fall time notification section 1622 is greater than a prescribed value, the frequency characteristic adjusting section 1614 adjusts an equalizer, not shown, to enhance the high frequency component of the test signal 1602.

The sampling section 110 and the sampling section 112 of the rise/fall time measurement apparatus 100 sample the output signal 1604 a certain number of times N while the output signal 1604 repeats for M cycles, where M and N are coprime. The sampling section 110 and the sampling section 112 respectively sample the output signal 1604 with threshold values that are different from each other. The rise/fall time notification section 1622 notifies the signal generating section 1610 concerning the rise/fall time of the output signal 1604, which is the statistical value calculated by the statistical value calculating sections 146 of the rise/fall time measurement apparatus 100.

Figure 16:
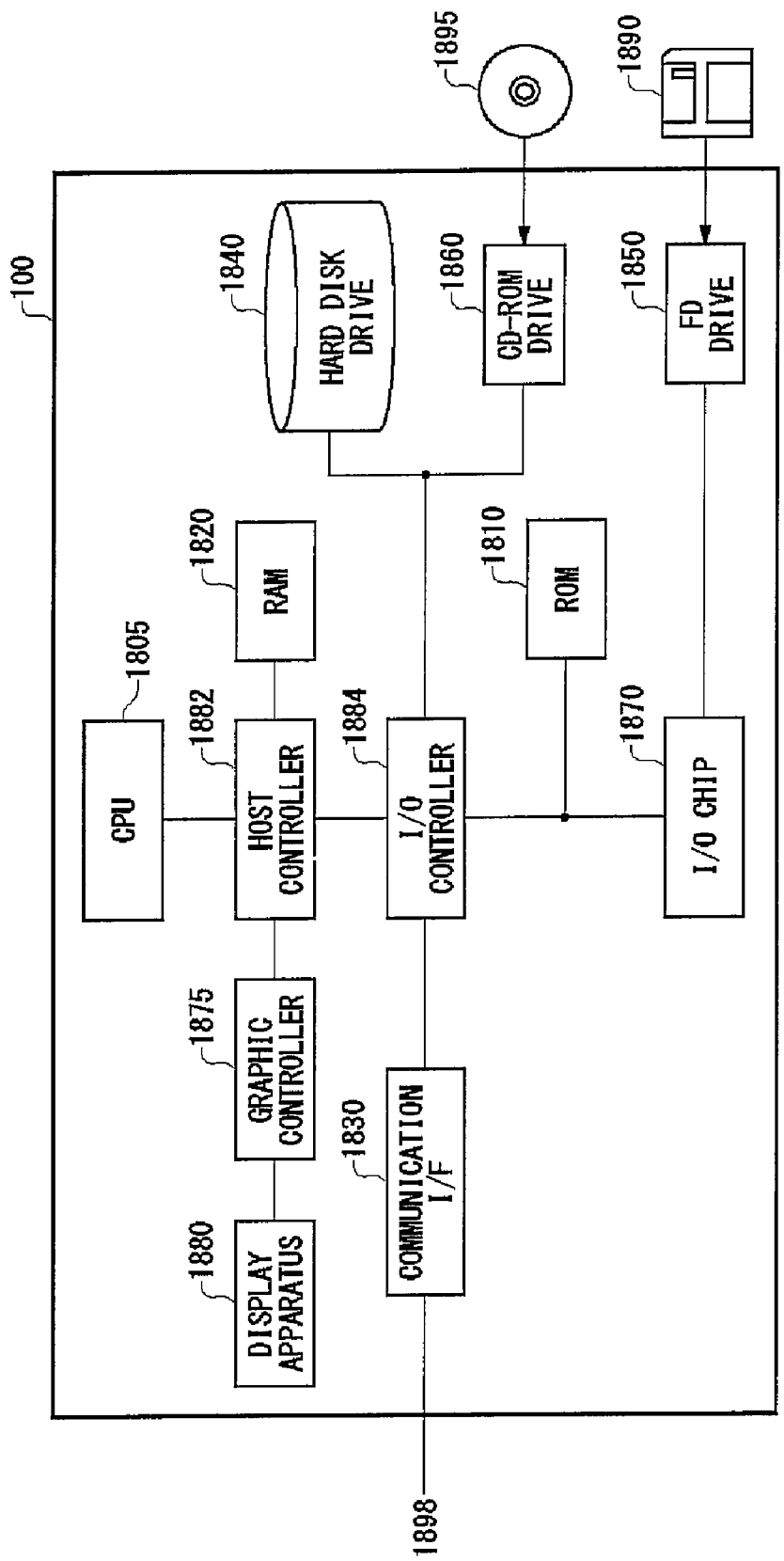
FIG. 16 shows an exemplary hardware configuration of the rise/fall time measurement apparatus 100.

FIG. 16 shows an exemplary hardware configuration of the rise/fall time measurement apparatus 100. More specifically, FIG. 16 shows an exemplary hardware configuration in which the rise/fall time measurement apparatus 100 is an electronic information processing apparatus such as a computer. The rise/fall time measurement apparatus 100 is provided with a CPU peripheral section, an input/output section, and a legacy input/output section. The CPU peripheral section includes a CPU 1805, a RAM 1820, a graphic controller 1875, and a display apparatus 1880 connected to each other by a host controller 1882. The input/output section includes a communication interface 1830, a hard disk drive 1840, and a CD-ROM drive 1860, all of which are connected to the host controller 1882 by an input/output controller 1884. The legacy input/output section includes a ROM 1810, a flexible disk drive 1850, and an input/output chip 1870, all of which are connected to the input/output controller 1884.

The host controller 1882 is connected to the RAM 1820 and is also connected to the CPU 1805 and graphic controller 1875 accessing the RAM 1820 at a high transfer rate. The CPU 1805 operates to control each section based on programs stored in the ROM 1810 and the RAM 1820. The graphic controller 1875 acquires image data generated by the CPU 1805 or the like on a frame buffer disposed inside the RAM 1820 and displays the image data in the display apparatus 1880. Alternatively, the graphic controller 1875 may internally include the frame buffer storing the image data generated by the CPU 1805 or the like.

The input/output controller 1884 connects the hard disk drive 1840 serving as a relatively high speed input/output apparatus, the communication interface 1830, and the CD- ROM drive 1860 to the host controller 1882. The hard disk drive 1840 stores the programs and data used by the CPU 1805. The communication interface 1830 is connected to a network communication apparatus 1898 to receive the programs or the data. The CD-ROM drive 1860 reads the programs and data from a CD-ROM 1895 and provides the read information to the hard disk drive 1840 and the communication interface 1830 via the RAM 1820.

The input/output controller 1884 is connected to the ROM 1810, and is also connected to the flexible disk drive 1850 and the input/output chip 1870 serving as a relatively high speed input/output apparatus. The ROM 1810 stores a boot program performed when the rise/fall time measurement apparatus 100 starts up, a program relying on the hardware of the rise/fall time measurement apparatus 100, and the like. The flexible disk drive 1850 reads the programs or data from a flexible disk 1890 and supplies the read information to the hard disk drive 1840 and the communication interface 1830 via the RAM 1820. The input/output chip 1870 connects the flexible disk drive 1850 to each of the input/output apparatuses via, a parallel port, a serial port, a keyboard port, a mouse port, or the like.

The programs performed by the CPU 1805 are stored on a recording medium such as the flexible disk 1890, the CD-ROM 1895, or an IC card and are provided by the user. The programs stored on the recording medium may be compressed or uncompressed. The programs are installed on the hard disk drive 1840 from the recording medium, are read by the RAM 1820, and are performed by the CPU 1805. The programs performed by the CPU 1805 cause the rise/fall time measurement apparatus 100 to function as the sampling section 110, the sampling section 112, the waveform reconfiguring section 142, the distribution generating section 144, and the statistical value calculating section 146 described in relation to FIGS. 1 to 15.

The programs shown above may be stored in an external storage medium. In addition to the flexible disk 1890 and the CD-ROM 1895, an optical recording medium such as a DVD or PD, a magneto-optical medium such as an MD, a tape medium, a semiconductor memory such as an IC card, or the like can be used as the recording medium. Furthermore, a storage apparatus such as a hard disk or a RAM disposed in a server system connected to the Internet or a specialized communication network may be used as the storage medium and the programs may be provided to the rise/fall time measurement apparatus 100 via the network.

Figure 17:
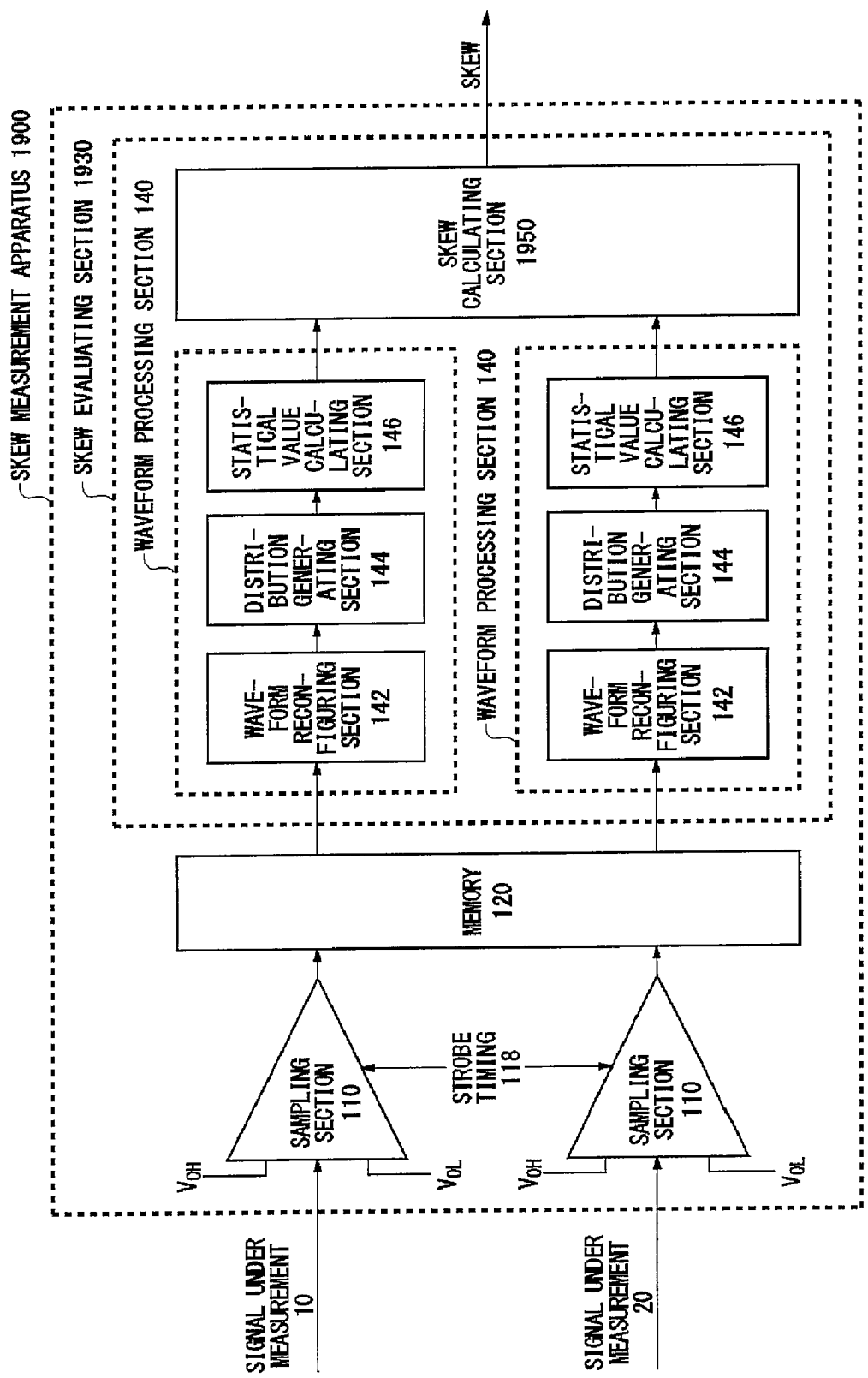
FIG. 17 shows an exemplary configuration of a skew measurement apparatus 1900.

FIG. 17 is a block diagram showing an exemplary configuration of a skew measurement apparatus 1900. As shown in FIG. 17, the skew measurement apparatus 1900 is provided with a plurality of sampling sections 110, the memory 120, and a skew evaluating section 1930. The skew measurement apparatus 1900 may have a configuration identical to that of the rise/fall time measurement apparatus 100 except that the skew measurement apparatus 1900 includes a plurality of sampling sections 110 having identical threshold values that receive a plurality of signals under measurement as input. The skew evaluating section 1930 includes the waveform processing section 140 and a skew calculating section 1950.

The skew evaluating section 1930 may include a plurality of waveform processing sections 140. For example, the waveform processing sections 140 calculate the average values of the edge timings of the signal under measurement 10 and a signal under measurement 20, respectively. The average values of the edge timings are examples of the statistical values of the edge timing distributions. The skew calculating section 1950 calculates the skew value between the signal under measurement 10 and the signal under measurement 20 by obtaining the difference between the average value of the edge timing of the signal under measurement 10 and the average value of the edge timing of the signal under measurement 20.

As a specific example, the skew measurement apparatus 1900 is provided with sampling sections that sample a plurality of signals under measurement, each sampling section sampling the respective signal under measurement having a cycle T for a certain number of cycles N while the signal under measurement repeats for M cycles, where M and N are coprime; waveform reconfiguring sections that rearrange the order of the sample values of each of the signals under measurement sampled by the sampling sections to have reconfigured ordinal ranks i by inputting the initial ordinal ranks k into the expression i=k·M mod N, where k is expressed by integers from 0 to N−1, and that use these rearranged sample values to shape a reconfigured waveform having the cycle T; distribution generating sections that generate timing distributions of the edges in the reconfigured waveform of each signal under measurement; and a skew calculating section that calculates the skew between the signal under measurement being compared based on the timing distributions of the signal under measurement.

Figure 18:
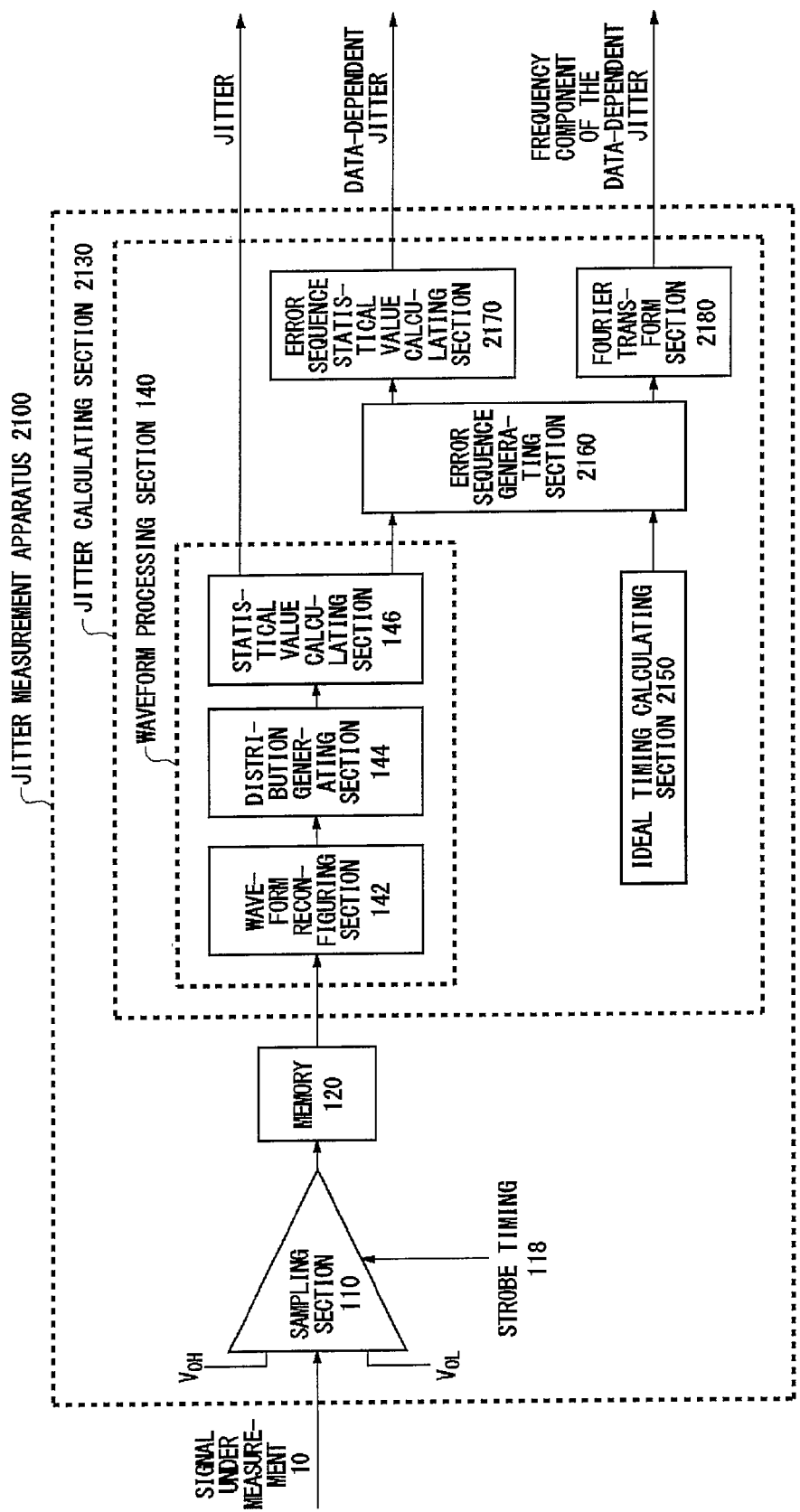
FIG. 18 shows an exemplary configuration of a jitter measurement apparatus 2100.

FIG. 18 is a block diagram showing an exemplary configuration of a jitter measurement apparatus 2100. The jitter measurement apparatus 2100 receives the signal under measurement 10 as input and outputs a jitter value of the signal under measurement 10. The jitter measurement apparatus 2100 may output a deterministic jitter value, such as a data-dependent jitter value, as well as a frequency component of the deterministic jitter. The jitter measurement apparatus 2100 is provided with the sampling section 110 and a jitter calculating section 2130, and may also be provided with the memory 120. The jitter calculating section 2130 calculates an edge timing distribution of the signal under measurement 10 and outputs the jitter value of the signal under measurement 10. The jitter calculating section 2130 may obtain the jitter value of the signal under measurement 10 by reading the input waveform $X_S[k]$ stored in the memory 120.

The jitter calculating section 2130 includes the waveform processing section 140, and may also include a ideal edge timing calculating section 2150, an error sequence generating section 2160, an error sequence statistical value calculating section 2170, and a Fourier transform section 2180. The error sequence generating section 2160 may generate an error sequence obtained by arranging, in a time-series, the errors between the expected values of the edge timing distribution calculated by the statistical value calculating section 146 and the ideal edge timing calculated by the ideal edge timing calculating section 2150. The error sequence statistical value calculating section 2170 may calculate the statistical value of the error sequence. The Fourier transform section 2180 may calculate the frequency component of the error sequence by performing a Fourier transform of the error sequence. If the errors included in the error sequence are not spaced uniformly on the time axis, the Fourier transform section 2180 may interpolate the jitter value at a bit boundary having no jitter value based on the previous and subsequent jitter values to generate the error sequence in which the errors are spaced uniformly on the time axis, and then perform the Fourier transform of the thus generated error sequence.

As a specific example, the jitter measurement apparatus 2100 is provided with a sampling section that samples a signal under measurement having a cycle T for a certain number of cycles N while the signal under measurement repeats for M cycles, where M and N are coprime; a waveform reconfiguring section that rearranges the order of the sample values of the signal under measurement sampled by the sampling section to have reconfigured ordinal ranks i by inputting the initial ordinal ranks k into the expression i=k·M mod N, where k is expressed by integers from 0 to N−1, and that uses these rearranged sample values to shape a reconfigured waveform having the cycle T; a distribution generating section that generates timing distributions of the edges in the reconfigured waveform; and a statistical value calculating section that calculates the statistical value of the timing distribution of the signal under measurement.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, the embodiments of the present invention can be adopted to realize a signal measurement apparatus, a signal measurement method, a recording medium, and a test apparatus for measuring a plurality of signals under measurement using a digital comparator such as a voltage comparator.

What is claimed is:

1. A signal measurement apparatus, comprising:
a plurality of sampling sections that each sample a signal under measurement having a cycle T with a threshold value, where the threshold values of at least two of the sampling sections are different from each other;
a waveform reconfiguring section that shapes a reconfigured waveform having the cycle T by rearranging ordinal ranks of sample values corresponding to each threshold value obtained by the sampling sections;
a distribution generating section that generates a timing distribution of edges in the reconfigured waveform corresponding to each threshold value; and
a calculating section that calculates rise time or fall time of the signal under measurement based on the timing distribution corresponding to each threshold value.

2. The signal measurement apparatus according to claim 1, wherein the sampling section samples the signal under measurement having the cycle T a certain number of times N while the signal under measurement repeats for M cycles, where M and N are coprime.

3. The signal measurement apparatus according to claim 2, wherein the waveform reconfiguring section rearranges initial ordinal ranks k of the sample values sampled by the sampling sections to have reconfigured ordinal ranks i by inputting the initial ordinal ranks k into an expression i=k·M mod N, where k is expressed by integers from 0 to N−1, and use these rearranged sample values to shape the reconfigured waveform having the cycle T.

4. The signal measurement apparatus according to claim 1, wherein the calculating section calculates the rise time or the fall time of the signal under measurement based on a difference between expected values of the timing distributions corresponding to the respective threshold values or as a minimum difference or a maximum difference between timing distribution ends of the signal under measurement corresponding to the respective threshold values.

5. The signal measurement apparatus according to claim 1, wherein
the distribution generating section includes:
a unit-interval waveform generating section that generates a plurality of unit-interval waveforms by dividing the reconfigured waveform into a plurality of unit intervals;
an aggregate value calculating section that calculates an aggregate value at each phase in each of the plurality of unit-interval waveforms by adding together the sample values at the same phase of each unit-interval waveform; and
a difference calculating section that calculates a difference between each pair of aggregate values at adjacent phases, and
the distribution generating section generates the timing distribution based on the difference calculated by the difference calculating section.

6. The signal measurement apparatus according to claim 5, wherein
the distribution generating section further includes a waveform inverting section that inverts the unit-interval waveform generated by the unit-interval waveform generating section, and
the aggregate value calculating section adds the sample values of the unit-interval waveforms having rising edges to the inverted sample values of the unit-interval waveforms having falling edges that are inverted by the waveform inverting section, or
adds the sample values of the unit-interval waveforms having falling edges to the inverted sample values of the unit-interval waveforms having rising edges that are inverted by the waveform inverting section.

7. The signal measurement apparatus according to claim 5, wherein the aggregate value calculating section adds together the sample values of the unit-interval waveforms having rising edges or the sample values of the unit-interval waveforms having falling edges.

8. The signal measurement apparatus according to claim 5, further comprising identical a data sequence unit-interval waveform group selecting section that selects, from among the unit-interval waveforms generated by the unit-interval waveform generating section, a group of unit-interval waveforms having identical data sequences in the signal under measurement immediately prior thereto, wherein
the aggregate value calculating section adds together the sample values of each unit-interval waveform in the group selected by the identical data sequence unit-interval waveform group selecting section.

9. The signal measurement apparatus according to claim 5, further comprising a prescribed bit unit-interval waveform group selecting section that selects the unit-interval waveforms generated by the unit-interval waveform generating section at prescribed bit intervals in the signal under measurement, wherein
the aggregate value calculating section adds together the sample values of each unit-interval waveform in the group selected by the prescribed bit unit-interval waveform group selecting section.

10. The signal measurement apparatus according to claim 6, further comprising a prescribed bit unit-interval waveform group selecting section that selects the unit-interval waveforms generated by the unit-interval waveform generating section at prescribed bit intervals in the signal under measurement, wherein
the aggregate value calculating section adds the sample values of the unit-interval waveforms having rising edges to the inverted sample values of the unit-interval waveforms having falling edges that are inverted by the waveform inverting section in the group of unit-interval waveforms selected by the prescribed bit unit-interval waveform group selecting section.

11. A signal measurement method performed by one or more computers, comprising the steps of:

sampling a signal under measurement having a cycle T with a plurality of threshold values, where at least two of the threshold values are different from each other;

shaping reconfigured waveforms having the cycle T by rearranging ordinal ranks of sample values corresponding to each threshold value obtained at the sampling step;

generating timing distributions of edges in the reconfigured waveform corresponding to each threshold value; and calculating rise time or fall time of the signal under measurement based on the timing distribution corresponding to each threshold value.

12. The signal measurement method according to claim 11, wherein the sampling step includes sampling the signal under measurement having the cycle T a certain number of times N while the signal under measurement repeats for M cycles, where M and N are coprime.

13. The signal measurement method according to claim 12, wherein the reconfiguring step includes rearranging initial ordinal ranks k of the sample values obtained at the sampling step to have reconfigured ordinal ranks i by inputting the initial ordinal ranks k into an expression i=k·M mod N, where k is expressed by integers from 0 to N−1, and using these rearranged sample values to shape the reconfigured waveforms having the cycle T.

14. A non-transitory recording medium storing thereon a computer program that, when used by an apparatus, causes the apparatus to function as a signal measurement apparatus comprising:

a plurality of sampling sections that each sample a signal under measurement having a cycle T with a threshold value, where the threshold values of at least two of the sampling sections are different from each other, a certain number of times N while the signal under measurement repeats for M cycles, where M and N are coprime;

a waveform reconfiguring section that rearranges initial ordinal ranks k of the sample values corresponding to each threshold value obtained by the sampling sections to have reconfigured ordinal ranks i by inputting the initial ordinal ranks k into an expression i=k·M mod N, where k is expressed by integers from 0 to N−1, and uses these rearranged sample values to shape the reconfigured waveforms having the cycle T;

a distribution generating section that generates a timing distribution of edges in the reconfigured waveform corresponding to each threshold value; and a calculating section that calculates rise time or fall time of the signal under measurement based on the timing distribution corresponding to each threshold value.

15. A test apparatus that provides a test signal to a device under test to test the device under test, comprising:

a signal measuring section that measures a plurality of output signals of the device under test, wherein the signal measuring section includes:

a plurality of sampling sections that each sample an output signal having a cycle T with a threshold value, where the threshold values of at least two of the sampling sections are different from each other, a certain number of times N while the output signal repeats for M cycles, where M and N are coprime;

a waveform reconfiguring section that rearranges initial ordinal ranks k of the sample values corresponding to each threshold value obtained by the sampling sections to have reconfigured ordinal ranks i by inputting the initial ordinal ranks k into an expression i=k·M mod N, where k is expressed by integers from 0 to N−1, and uses these rearranged sample values to shape the reconfigured waveforms having the cycle T;

a distribution generating section that generates a timing distribution of edges in the reconfigured waveform corresponding to each threshold value; and a calculating section that calculates rise time or fall time of the output signal based on the timing distribution corresponding to each threshold value.

\* \* \* \* \*